(12) United States Patent
Vrudhula et al.

(10) Patent No.: US 10,447,249 B2
(45) Date of Patent: Oct. 15, 2019

(54) HOLD VIOLATION FREE SCAN CHAIN AND SCANNING MECHANISM FOR TESTING OF SYNCHRONOUS DIGITAL VLSI CIRCUITS

(71) Applicants: Sarma Vrudhula, Chandler, AZ (US); Niranjan Kulkarni, Tempe, AZ (US)

(72) Inventors: Sarma Vrudhula, Chandler, AZ (US); Niranjan Kulkarni, Tempe, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 182 days.

(21) Appl. No.: 15/568,858

(22) PCT Filed: May 23, 2016

(86) PCT No.: PCT/US2016/033807
§ 371 (c)(1),
(2) Date: Oct. 24, 2017

(87) PCT Pub. No.: WO2016/191383
PCT Pub. Date: Dec. 1, 2016

(65) Prior Publication Data
US 2018/0102766 A1    Apr. 12, 2018

Related U.S. Application Data

(60) Provisional application No. 62/165,348, filed on May 22, 2015.

(51) Int. Cl.
*H03K 3/356* (2006.01)
*G01R 31/3185* (2006.01)
(Continued)

(52) U.S. Cl.
CPC ... *H03K 3/356086* (2013.01); *G01R 31/3177* (2013.01); *G01R 31/318541* (2013.01); *H03K 3/0375* (2013.01)

(58) Field of Classification Search
CPC .......... H03K 3/356086; H03K 3/0375; G01R 31/3177; G01R 31/318541
(Continued)

(56) References Cited

U.S. PATENT DOCUMENTS 5,576,651 A   11/1996  Phillips
5,920,575 A   7/1999   Gregor et al.
(Continued)

FOREIGN PATENT DOCUMENTS

KR   101418016 B1   7/2014

OTHER PUBLICATIONS

International Search Report and Written Opinion for International Patent Application No. PCT/US2016/033807, dated Aug. 24, 2016, 8 pages.
(Continued)

*Primary Examiner* — Metasebia T Retebo
(74) *Attorney, Agent, or Firm* — Winthrow & Terranova, P.L.L.C.

(57) ABSTRACT

A sequential state element (SSE) is disclosed. In one embodiment, an SSE includes a differential sense flip flop (DSFF) and a completion detection circuit (CDC) operably associated with the DSFF. The DSFF is configured to generate a differential logical output. During a normal operational mode, the DSFF is synchronized by a clock signal to provide a differential logical output in a differential output state in accordance with a data input or in a precharge state based on the clock signal. The differential logical output is provided in a differential output state in accordance with a test input during a scan mode. The CDC is configured to generate a test enable input during the scan mode that indicates the scan mode once the differential logical output is in the differential output state. Accordingly, another SSE
(Continued)

can be asynchronously triggered to operate in the scan mode without a separate scan clock.

18 Claims, 5 Drawing Sheets

(51) Int. Cl.
    *H03K 3/037*     (2006.01)
    *G01R 31/3177*     (2006.01)

(58) Field of Classification Search
    USPC .......................................................... 327/211
    See application file for complete search history.

(56) References Cited

U.S. PATENT DOCUMENTS

| | | |
|---|---|---|
| 8,106,698 B2 | 1/2012 | Kim |
| 2007/0260954 A1* | 11/2007 | Wong ............. G01R 31/318575 714/733 |
| 2012/0146697 A1 | 6/2012 | Leach et al. |
| 2013/0021076 A1 | 1/2013 | Kuenemund et al. |
| 2016/0248405 A1* | 8/2016 | Bailey ................... H03K 3/0372 |
| 2016/0341793 A1* | 11/2016 | Bailey .............. G01R 31/31727 |

OTHER PUBLICATIONS

International Preliminary Report on Patentability for International Patent Application No. PCT/US2016/033807, dated Dec. 7, 2017, 7 pages.

\* cited by examiner

HOLD VIOLATION FREE SCAN CHAIN AND SCANNING MECHANISM FOR TESTING OF SYNCHRONOUS DIGITAL VLSI CIRCUITS

RELATED APPLICATIONS

This application is a 35 USC 371 national phase filing of PCT/US16/33807, filed May 23, 2016, which claims the benefit of provisional patent application Ser. No. 62/165,348, filed May 22, 2015, the disclosures of which are hereby incorporated herein by reference in their entireties.

GOVERNMENT SUPPORT

This invention was made with government support under 1230401 and 1237856 awarded by the National Science Foundation. The government has certain rights in the invention.

FIELD OF THE DISCLOSURE

This disclosure relates generally to digital circuits and methods of operating the same.

BACKGROUND

Digital components, such as sequential state elements, are typically used store data generated by a functional logic block and then pass the data to another functional logic block within an integrated circuit (IC). In order to test the functionality of the digital circuit, the sequential state elements need to be capable of scanning known test information into the sequential state elements in order to determine if the pipeline circuit and the pipeline stages are operating correctly.

Scanning is therefore an important and often indispensable mechanism for testing the operation of digital circuits. Unfortunately, scanning mechanisms often introduce a significant amount of complexity into a sequential state element as well as presenting other disadvantages. For example, scanning require separate scan clock signals to operate appropriately during testing to prevent hold time violations. This can significantly complicate clock routing in the digital circuit. Additionally, when designing ICs, computer aided design tools have to optimize timing not only for normal operations but also for the scanning mechanism. This can lead to timing inefficiencies in the designed IC. Therefore what is needed are scanning mechanisms that introduce less complexity and timing inefficiencies into an IC.

SUMMARY

This disclosure relates to digital circuits and methods of operating the same. In one embodiment, a digital circuit includes a differential sense flip flop (DSFF) and a completion detection circuit (CDC) operably associated with the DSFF. The DSFF is configured to generate a differential logical output. The differential logical output is set to a differential output state in accordance with a data input in response to a test enable input indicating a normal operational mode and a clock signal being in a first clock state. The differential logical output is provided in a precharge state in response to the test enable input indicating the normal operational mode and the clock signal being in a second clock state. Finally, the differential logical output is provided a differential output state set in accordance with a test input in response to the first test enable input indicating a scan mode and the clock signal being in the second clock state.

When the differential logical output is provided in differential output state, this means that the DSFF has completed the actions necessary to provide the differential logical output in accordance with the received input. As such, the CDC is configured to generate a second test enable input to trigger other sequential state elements. The CDC is configured to set the second test enable input so as to indicate the scan mode in response to the first test enable input indicating the scan mode and the differential logical output being provided in the differential output state. On the other hand, the second test enable input is set to indicate the normal operational mode in response to the first test enable input indicating the normal operational mode.

In this way, a separate scan clock is not needed during the scan mode as the test enable input can be used to coordinate the transfer of test inputs so that when the DSFF has completed registering its test input another sequential state element can be triggered to operate in the scan mode. For example, as explained below the sequential state element triggered by the second test enable input generated by the CDC may be provided in a previous pipeline stage. Furthermore, the DSFF may receive the test input as the data output from the sequential state element of the previous pipeline stage. However, the second test enable input won't trigger this sequential state element in the scan mode until the DSFF has completed providing the differential logical output in the differential output state. This therefore eliminates hold time violations since the sequential state element in the previous pipeline stage won't latch until the DSFF has completed providing the differential logical output in the differential output state. Furthermore, the CDC allows for a scan chain of sequential state elements to operate asynchronously without the need for a separate scan clock signal. This thereby would reduce the complexity of the pipeline circuit since a separate clock signal is not required for the scan mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
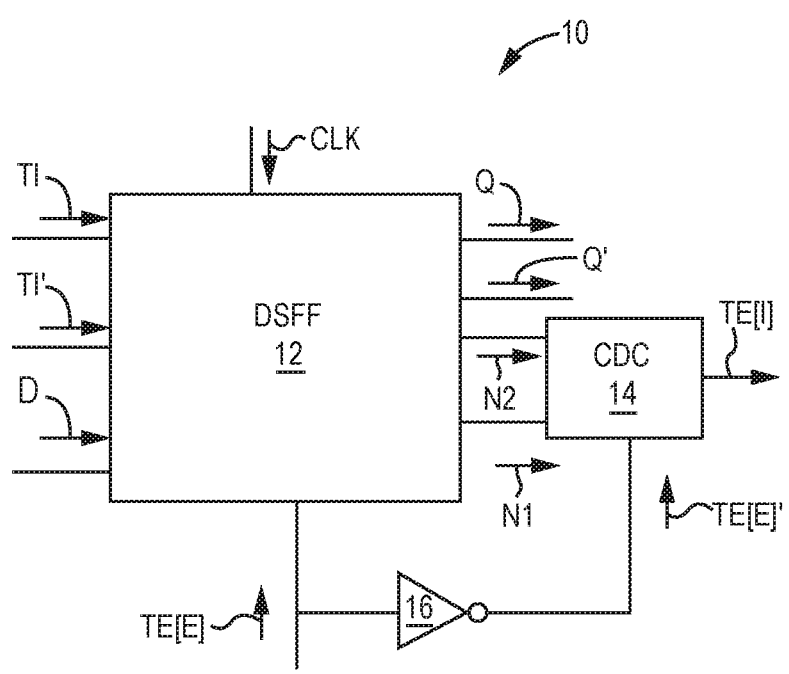
FIG. 1 illustrates one embodiment of a sequential state element (SSE) that includes a differential sense flip flop (DSFF) and a completion detection circuit (CDC) operably associated with the DSFF.

FIG. 1 illustrates one embodiment of a sequential state element (SSE) 10 in accordance with the teachings of this disclosure. In this embodiment, the SSE 10 includes a differential sense flip flop (DSFF) 12, a completion detection circuit (CDC) 14, and an inverter gate 16. The DSFF 12 is configured to receive a data input D, a test input TI, an inverted test input TI', a test enable input TE[E], and a clock signal CLK. The DSFF 12 is configured to generate a differential logical output DLO, a data output Q, and an inverted data output Q'. The inverter gate 16 is configured to receive the test enable input TE[E] and generate an inverted test enable input TE[E]' from the test enable input TE[E].

With regard to the CDC 14, the CDC 14 is operably associated with the DSFF 12 and with the inverter gate 16. More specifically, in this embodiment, the CDC 24 is configured to receive the differential logical output DLO from the DSFF 12 and the inverted test enable input TE[E]' from the inverter gate 16. The CDC 14 is configured to generate a test enable input TEM based on the differential logical output DLO and the test enable input TE[E]', and therefore based on the non-inverted test enable input TE[E] also.

The SSE 10 is operable in any one of a set of operational modes. With regards to this discussion, the set of operational modes includes a normal operational mode and a scan mode. It should be noted that alternate embodiments of the SSE 10 could also be designed to operate in additional modes other than these two modes. In any case, the DSFF 12 is synchronized by the clock signal CLK during the normal operational mode. The test enable input TE[E] (and thus also the inverted test enable input TE[E]') indicates any one of either the normal operational mode and the scan mode. The test enable input TE[E] is exogenous to the SSE 10 and thus not generated internally but rather by external circuitry.

The SSE 10 is triggered to operate in the normal operational mode in response to the test enable input TE[E] indicating the normal operational mode. During the normal operational mode, the SSE 10 is configured to store and transmit logical states of the data input D. The data input D represents logical states of a serial sequence of bits. For example, each of these logical states may be generated by a combinational logic circuit (CL) (not shown in FIG. 1) of a pipeline stage, as explained in further detail below. As the logical states of new bits are received by the CL, the CL is configured to perform some type of computational function thereby resulting in a serial sequence of logical states of resultant bits from the CL. While the test enable input TE[E] is indicating the normal operational mode, the SSE 10 holds one of these logical states and then passes the logical state (or a logical state determined in accordance with the received logical state) so that a new logical state can be set up. The holding and passing of the logical states is synchronized by the clock signal CLK, which oscillates between a first clock state and a second clock state. The amount of time it takes the clock signal CLK to complete one oscillation of the first clock state and the second clock state is generally referred to as a clock period. Generally speaking, the clock period has a relationship with a temporal length between the logical states of the data input D. As such, the clock signal CLK provides the required coordination so that logical states are not held or passed inappropriately.

In this regard, the SSE 10 of FIG. 1 is operable in a reset state and an evaluation state while the test enable signal TE[E] indicates the normal operational mode. In this embodiment, the test enable input TE[E] indicates the normal operational mode by having a voltage level that indicates a logical state of "0." As such, the inverted test enable input TE[E]' indicates the normal operational mode by having a high voltage level that indicates the logical state of "1." The SSE 10 cycles through the reset state and the evaluation state during the normal operational mode in accordance with the clock signal CLK. More specifically, in order to enter the reset state, the non-inverted clock signal CLK is set to a low voltage level corresponding to a logical state of "0."

As shown in FIG. 1, the DSFF 12 is configured to generate a first logical output N1 and a second logical output N2 as the differential logical output DLO. During the evaluation state, the DSFF 12 is configured to generate the differential logical output DLO so that the differential logical output DLO is set in a differential output state. The differential output state is provided in accordance with the data input D in response to the test enable signal TE[E] indicating a normal operational mode and the clock signal CLK being in the first clock state, which in this example is a high voltage state that indicates a logical state of "1." The differential output state of the differential logical output DLO may be any one of a first differential output state of "1/0" and a second differential output state "0/1." Thus, to provide the differential logical output DLO in the first differential output state, the DSFF 12 is configured to generate the first logical output N1 to have a logical state of "1" and to generate the second logical output N2 to have the opposite logical state of "0." To provide the differential logical output DLO in the second differential output state, the DSFF 12 is configured to generate the first logical output N1 to have a logical state of "0" and to generate the second logical output N2 having the opposite logical state of "1." The DSFF 12 is thus transparent to the data input D during the evaluation state and is configured to provide the differential logical output DLO in the first differential output state or in the second differential output state based on a logical state of the data input D (i.e., whether the data input D is a logical state of "1" or a logical state of "0.")

The DSFF 12 is configured to generate a data output Q and an inverted data output Q' in accordance with the differential output state of the differential logical output DLO. For example, the DSFF 12 is configured to set the data output Q to logic "0" and the inverted data output Q' to logic "1" in response to the differential logical output DLO being provided at the first differential output state of "1/0." Additionally, the DSFF 12 is configured to is configured to set the data output Q to logic "1" and the inverted data output Q' to logic "0" in response to the differential logical output DLO being provided at the second differential output state of "0/1."

With regard to the reset state, the DSFF 12 is configured to set the differential logical output DLO in a precharge state in response to the test enable input TE[E] indicating the normal operational mode and the clock signal CLK being in the second clock state. In this embodiment, the differential logical output DLO is set to a precharge state of "1/1" during the reset state. Additionally, the DSFF 12 becomes opaque during the reset state and is configured to hold the data output Q and the inverted data output Q'. Accordingly, the logical state of the data output Q and the inverted data output Q' is unaffected by the next logical state of the data input D. As long as the test enable input TE[E] indicates the normal operational mode, the DSFF 12 can switch between the evaluation state and the reset state in accordance with the clock signal CLK. Each cycle through the evaluation state and reset state would result in the process above being repeated for subsequent logical state provided by the data input D and/or an inverted data input D'.

However, the SSE 10 is also configured to operate in the scan mode. During the scan mode, the SSE 10 ignores the data input D and the inverted data input D'. Rather, the clock signal CLK is held in the second clock state and the test enable input TE[E] indicates scan mode. In this embodiment, the scan mode is indicated by the test enable input TE[E] having a logical state of "1," and the inverted test enable signal TE[E]' having a logical state of "0." The DSFF 12 is configured to generate the differential logical output DLO so that the differential logical output DLO is set in accordance with the test input TI and/or the inverted test input TI' in response to the test enable signal TE[E] indicating the scan mode and the clock signal CLK being in the second clock state. The differential output state of the differential logical output DLO may be either one of the first differential output state of "1/0" or the second differential output state "1/0" depending on the logical state of the test input TI and/or the logical state of the inverted test input TI'. Thus, depending on the logical state of the test input TI and/or the logical state of the inverted test input TI', the DSFF 12 is configured to generate the first logical output N1 to have a logical state of "1" and to generate the second logical output N2 to have the opposite logical state of "0" or to generate the first logical output N1 to have a logical state of "0" and to generate the second logical output N2 to have the opposite logical state of "1." The DSFF 12 is thus transparent to the test input TI and/or the inverted test input TI' during the scan mode and is configured to provide the differential logical output DLO in the first differential output state or in the second differential output state based on the logical state of the test input TI and/or the logical state of the inverted test input TI'.

During the scan mode, the DSFF 12 is configured to generate the data output Q and the inverted data output Q' in accordance with the differential output state of the differential logical output DLO, which was determined by the logical state of the test input TI and/or the logical state of the inverted test input TI'. As such, the scan mode allows for known logical states to be put into the SSE 10. This allows for the SSE 10 to be tested along with any combinational logic CL that receives the data output Q or the inverted data output Q' from the DSFF 12. Note that since the clock signal CLK is being held in the second clock state, the DSFF 12 will operate in the reset state in response to the test enable signal TE[E] indicating the normal operational mode. Accordingly, the DSFF 12 becomes opaque during the reset state and is configured to hold the data output Q and the inverted data output Q' as provided during the scan mode. Thus, the DSFF 12 is configured to set the differential logical output DLO in a precharge state of "1/1."

The CDC 14 is operably associated with the DSFF 12 and is configured to generate the test enable input TE[I]. Thus, the test enable input TE[I] is thus generated endogenously by the SSE 10. In this embodiment, the CDC 14 is operable to receive the differential logical output DLO from the DSFF 12 and the inverted test enable input TE[E]' from the inverter gate 16. The CDC 14 is configured to generate the test enable input TE[I] so that the test enable input TE[I]' is set to indicate the normal operational mode in response to the test enable signal TE[E] (and thus more directly in response to the inverted test enable input TE[E]') indicating the normal operational mode. As long as the test enable input TE[E] indicates the normal operational mode, the CDC 14 generates the test enable input TE[I] indicate to other SSEs to remain in the normal operational mode. On the other hand, the CDC 14 is configured to generate the test enable input TE[I] so that the test enable input TE[I] indicates the scan mode in response to the test enable signal TE[E] (more directly in response to the inverted test enable input TE[E]') indicating the scan mode and the differential logical output DLO being in the differential output state. The reason that the test enable input TE[I] does not indicate the scan mode until both the test enable signal TE[E] indicates the scan mode and the differential logical output DLO is the differential output state is because once the differential logical output DLO is in the differential output state, the SSE 10 has completed the necessary actions so that the data output Q is set based on the test input TI and/or the inverted test input TI'. As such, the test enable input TE[I] allows the SSE 10 to indicate that the SSE 10 has completed the necessary actions to register the current logical state of the test input TI and/or the inverted test input TI' and that therefore it is ready for another SSE to operate in the scan mode. The test enable input TE[I] can therefore be utilized for synchronization as explained in further detail below.

Figure 2:
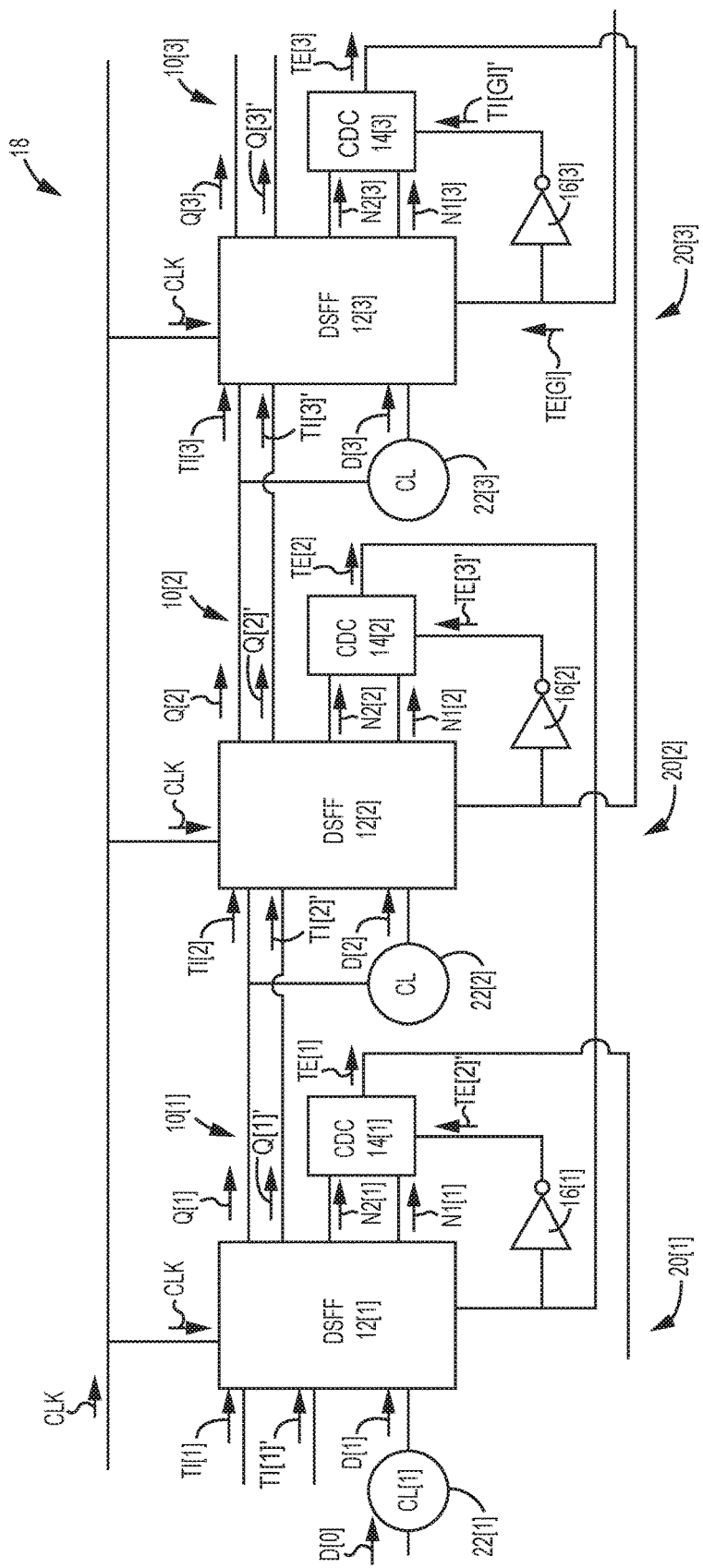
FIG. 2 illustrates a pipeline circuit having a sequence of three pipeline stages wherein each of the pipeline stages includes an SSE like the SSE found in FIG. 1.

FIG. 2 illustrates a block diagram of one embodiment of a pipeline circuit 18, which is an example of a digital circuit. The pipeline circuit 18 is a finite state machine. The operation of the finite state machine provided by the pipeline circuit 18 may be loosely analogized to an assembly line. More specifically, the pipeline circuit 18 has pipeline stages 20[1], 20[2], and 20[3] (referred to generically as pipeline stages 20). In the pipeline circuit 18, the different pipeline stages 20[1], 20[2], and 20[3] each handle a different operation of the finite state machine so that the various operations of the finite state machine are handled sequentially. Examples of operations that may be provided by the different pipeline stages 20[1], 20[2], and 20[3] for the finite state machine include instruction fetch operations, instruction decode operations, encode operations, register file operations, fetch operations, instruction execution operations, data memory access operations, register file write back operations, and/or the like. As shown in FIG. 2, each of the pipeline stages 20[1], 20[2], and 20[3] in the pipeline circuit 18 includes a combinational logic circuit (CL) (referred to generically as CL 22 and specifically as CL 22[1], CL 22[2], and CL 22[3]) an SSE ((referred to generically as SSEs 10 and specifically as SSE 10[1], SSE 10[2], and SSE 10[3])).

In the pipeline circuit 18, the CLs 22[1], 22[2], and 22[3] of the different pipeline stages 20[1], 20[2], and 20[3] are specialized to handle the particular operation of each of the pipeline stages 20[1], 20[2], and 20[3]. Accordingly, for each of the pipeline stages 20[1], 20[2], and 20[3] in the pipeline circuit 18, the CLs include an arrangement of combinational logic elements (i.e., logic gates) configured to provide logic function that implements the operation of the pipeline stages 20[1], 20[2], and 20[3]. The CLs 22[1], 22[2], and 22[3] may each include static combinational elements and/or dynamic combinational elements depending on the particular application. While the pipeline circuit 18 shown in FIG. 2 has three pipeline stages 20[1], 20[2], and 20[3], it should be noted that the pipeline circuit 18 may include any number of pipeline stages. This may depend on the particular finite state machine to be provided for the particular application. Furthermore, the pipeline circuit 18 shown in FIG. 2 has been simplified for the purposes of describing relevant concepts related to the application. In particular, each of the pipeline stages 20[1], 20[2], and 20[3] is shown having a particular one of the SSE 10[1], SSE 10[2], and SSE 10[3] so that each of the pipeline stages 20[1], 20[2], and 20[3] stores one bit. Obviously, this is generally not the case and each of the pipeline stages 20[1], 20[2], and 20[3] may include various SSEs like the SSE 10[1], the SSE 10[2], and the SSE 10[3] for multi-bit storage. FIG. 2 has however been simplified for the sake of clarity but this arrangement should not and is not intended in any way to limit the scope of the disclosure.

The SSE 10[1], SSE 10[2], and SSE 10[3] are each identical to the SSE 10 shown in FIG. 1 and operate in the same fashion as the SSE 10 described in FIG. 1. The pipeline circuit 18 is thus operable in at least the normal operational mode and in the scan mode. To synchronize the pipeline stages 20[1], 20[2], and 20[3] of the pipeline circuit 18 during the normal operational mode, the SSE 10[1], SSE 10[2], and SSE 10[3] coordinate transfer of valid logical states between the different pipeline stages 20[1], 20[2], and 20[3] in accordance with the clock signal CLK, which in this example is a global clock signal provided to each of the pipeline stages 20. Thus, in this particular embodiment, the pipeline circuit 18 is assumed to be arranged in a single-phase clock style so that each of the SSE 10[1], SSE 10[2], and SSE 10[3] in the different pipeline stages 20[1], 20[2], and 20[3] receives the same clock signal CLK. Alternatively, multiple-phase clock styles may be used where different versions of the clock signal CLK are provided at different clock phases. This may depend, for example, on the particular clock distribution technique used for the pipeline circuit 18. When multiple-phase clock styles are implemented, each of the SSEs 10 in the different pipeline stages 20[1], 20[2], and 20[3] may receive a different version of the clock signal CLK within each of the pipeline circuits 18.

The SSE 10[1], SSE 10[2], and SSE 10[3] are each identical to and operate in the same fashion as the SSE 10 described in FIG. 1. Note that each of the SSE 10[1], SSE 10[2], and SSE 10[3] include a DSFF 12[1], a DSFF 12[2], and a DSFF 12[3] (referred to generically as the DSFFs 12, respectively) where each is identical and operates in the same manner as the DSFF 12 described above with respect to FIG. 1. Additionally, each of the SSE 10[1], SSE 10[2], and SSE 10[3] include a CDC 14[1], a CDC 14[2], and a CDC 14[3] (referred to generically as the CDC 14, respectively) where each is identical and operates in the same manner as the CDC 14 described above with respect to FIG. 1. Finally, each of the SSE 10[1], SSE 10[2], and SSE 10[3] include an inverter gate 16[1], an inverter gate 16[2], and an inverter gate 16[3] (referred to generically as the inverter gates 16, respectively) where each is identical and operates in the same manner as the inverter gate 16 described above with respect to FIG. 1.

As such, the pipeline circuit 18 works like an assembly line where the pipeline stage 20[1] is the beginning pipeline stage, the pipeline stage 20[2] is an intermediate pipeline stage, and the pipeline stage 20[3] is the final pipeline stage in the sequence of pipeline stages 20 provided in the pipeline circuit 18. Note that alternative embodiments of the pipeline circuit 18 may have any number of pipeline stages 10, greater or equal to two (2). Thus, other embodiments of the pipeline circuit 18 may include any number of additional intermediary pipeline stages or no intermediary pipeline stages at all. This and other variations of the pipeline circuit 18 would be apparent to one of ordinary skill in the art in light of this disclosure.

As just mentioned above, each of the SSE 10[1], SSE 10[2], and SSE 10[3] are identical to the SSE 10 described above with respect to FIG. 1. The CLs 22[1], 22[2], 22[3] each receive a data output and generate a data input (referred to generically as the data inputs D and specifically as the data inputs D[1], D[2], D[3]). Each of the data inputs D[1], D[2], D[3] is thus analogous to the data input D described above with respect to FIG. 1. For the pipeline stage 20[1], which is the beginning pipeline stage, a data output Q[0] is received by the CL 22[1] from some external circuitry such as a memory system or the like. The CL 22[1] is configured to generate the data input D[1] in accordance with the data output D[0].

Each of the DSFF 12[1], DSFF 12[2], and DSFF 12[3] is configured to generate a corresponding data output (referred to generically as data outputs Q and specifically as data outputs Q[1], Q[2], Q[3]) and a corresponding inverted data output (referred to generically as inverted data outputs Q' and specifically as inverted data outputs Q[1]', Q[2]', Q[3]') in the same manner as the DSFF 12 described above with respect to the data output Q and the inverted data output Q' described above with respect to FIG. 1. For the subsequent pipeline stages 20[2], 20[3] in the pipeline circuit 18 after the pipeline stage 20[1], each of the CLs 22[2], 22[3] are configured to receive the data output Q[1], Q[2] from the previous pipeline stage 20[1], 20[2], respectively. Each of the CLs 22[2], 22[3] are thus configured to generate their corresponding data input D[2], D[3] from the corresponding data output Q[1], Q[2] of the DSFF 12[1], DSFF 12[2] of the corresponding previous pipeline stage 20[1], 20[2]. However, assuming that the pipeline stage 20[3] is the final pipeline stage, the DSFF 12[3] does not provide the data output Q[3] to a subsequent pipeline stage but rather the data output Q[3] may be considered a global data output resulting from the computation provided by the pipeline circuit 18.

Each of the DSFF 12[1], DSFF 12[2], and DSFF 12[3] is configured to generate a corresponding differential logical output (referred to generically as the differential logical outputs DLO and specifically as the differential logical outputs DLO[1], DLO[2], DLO[3]) as described above with respect to FIG. 1. Thus, each of the DSFF 12[1], DSFF 12[2], and DSFF 12[3] is configured to generate a corresponding first logical output (referred to generically as the first logical outputs N1 and specifically as the first logical outputs N1[1], N1[2], N1[3]) and to generate a corresponding second logical output (referred to generically as the second logical outputs N2 and specifically as the second logical outputs N2[1], N2[2], N2[3]) as described above with respect to FIG. 1.

Thus, each of the CDC 14[1], CDC 14[2], and CDC 14[3] is configured to receive the differential logical output DLO[1], DLO[2], DLO[3] from the DSFF 12[1], DSFF 12[2], and DSFF 12[3] in its corresponding pipeline stage 20[1], 20[2], 20[3]. Furthermore, each of the CDC 14[1], CDC 14[2], and CDC 14[3] is configured to generate a corresponding test enable input (referred to generically as test enable input TE and specifically as test enable inputs TE[1], TE[2], TE[3]) in the same manner described above with respect to the CDC 14 shown in FIG. 1. Thus, for each of the pipeline stages 20[1], 20[2], 20[3], the respective test enable input TE[1], TE[2], TE[3] corresponds with the test enable input TE[I] described above with respect to FIG. 1.

For the pipeline stages 20[1], 20[2] in the pipeline circuit 18 before the pipeline stage 20[3], each of the DSFF 12[1], 12[2] are configured to receive the test enable input TE[2], TE[3] from the subsequent pipeline stage 20[2], 20[3], respectively. Thus, for each of the pipeline stages pipeline stages 20[1], 20[2], the test enable input TE[E] described above with respect to FIG. 1 corresponds to the test enable input TE[2], TE[3] from the subsequent pipeline stage 20[2], 20[3]. Since the pipeline stage 20[3] is the final pipeline stage, the DSFF 12[3] is configured to receive a test enable input TE[GI], which is a global test enable input. Thus, for the pipeline stage 20[3], the test enable input TE[GI] corresponds with the test enable input TE[E] described above with respect to FIG. 1.

Furthermore, the CDC 14[1] of the beginning pipeline stage 20[1] is configured to provide the test enable input TE[1] to external circuitry to indicate that all of the SSEs 10 have registered a test input. Each of the inverter gate 16[1], inverter gate 16[2], and inverter gate 16[3] is configured to generate a corresponding inverted test enable input (referred to generically as inverted test enable inputs TE and specifically as inverted test enable inputs TE[2]', TE[3]', TE[GI]') in the same manner as the inverter gate 16 described above with respect to the inverted test enable input TE[E]' shown in FIG. 1.

The pipeline stage 20[1] as the beginning pipeline stage is operable to receive the test input TI[1] and the inverted test input TI[1]', which in this example are a global test input and an inverted global test input respectively. With regard to FIG. 1, the test input TI[1] and the inverted test input TI[1]' correspond to the test input TI and the inverted test input TI' described above with respect to FIG. 1. For the subsequent pipeline stages 20[2], 20[3] in the pipeline circuit 18 after the pipeline stage 20[1], each of the DSFFs 12[2], 12[3] are configured to receive the data output Q[1], Q[2] from the previous pipeline stage 20[1], 20[2], respectively as a test input TI[2], TI[3] for the pipeline stage 20[2], 20[3]. The data output Q[1], Q[2] and thus the test input TI[2], TI[3] correspond with the test input TI described above with respect to FIG. 1. Also, for the subsequent pipeline stages 20[2], 20[3] in the pipeline circuit 18 after the pipeline stage 20[1], each of the DSFFs 12[2], 12[3] are configured to receive the inverted data output Q[1]', Q[2]' from the previous pipeline stage 20[1], 20[2], respectively as an inverted test input TI[2]', TI[3]' for the pipeline stage 20[2], 20[3]. The inverted data output Q[1]', Q[2]' and thus the inverted test input TI[2]', TI[3]' correspond with the inverted test input TI' described above with respect to FIG. 1.

In the subsequent pipeline stages 20[2], 20[3] in the pipeline circuit 18 after the pipeline stage 20[1], each of the DSFFs 12[2], 12[3] are configured to receive the data output Q[1], Q[2] (as a test input TI[2], TI[3]) from the previous pipeline stage 20[1], 20[2]. For the pipeline stage 20[2], 20[3], each of the data the test inputs TI[2], TI[3] correspond with the test input TI described above with respect to FIG. 1. Also, for the subsequent pipeline stages 20[2], 20[3] in the pipeline circuit 18 after the pipeline stage 20[1], each of the DSFFs 12[2], 12[3] are configured to receive the inverted data output Q[1]', Q[2]' (as a test input TI[2], TI[3]) from the previous pipeline stage 20[1], 20[2] (thus also the inverted test input TI[2]', TI[3])]. For the subsequent pipeline stages 20[2], 20[3], each of the inverted test input TI[2]', TI[3]' correspond with the inverted test input TI' described above with respect to FIG. 1.

Note that the test input TI[1] and the inverted test input TI[1]' are the (non-inverted/inverted) global test inputs that are received by the DSFF 12[1], which is the beginning pipeline stage 20[1]. Thus, the SSE 10[3] will operate in the scan mode first. However, the CDC 14[3] does not generate the test enable input TE[3] to indicate the scan mode until both the test enable input TE[GI] indicates the normal operational mode and the differential logical output DLO[3] is provided in the differential output state. The DSFF 12[3] thus generates the data output Q[3] and the inverted data output Q[3]' so that each is set equal to the test input TI[3] and the inverted test input TI[3]', respectively. The test input TI[3] and the inverted test input TI[3]' are the data output Q[2] and the inverted data output Q[2]' from the DSFF 12[2] in the SSE 10[2] of the previous pipeline stage 20(2) while the test enable input[GI] indicates the scan mode.

Since the clock signal CLK is being held in the second clock state during the scan mode, the SSE[3] will be provided in the reset state so as to hold the data output Q[3] and the inverted data output Q[3]' in response to the test enable input TE[GI] indicating the normal operational mode. In response to the test enable input TE[GI] indicating the scan mode and the differential logical output DLO[3] being provided in the differential output state, the CDC 14[3] is configured to generate the test enable input TE[3] to indicate the scan mode. Accordingly, the CDC 14[3] triggers the SSE 10[2] to operate in the scan mode.

The SSE 10[2] will operate in the scan mode second. However, the CDC 14[2] does not generate the test enable input TE[2] to indicate the scan mode until both the test enable input TE[3] indicates the normal operational mode and the differential logical output DLO[2] is provided in the differential output state. The DSFF 12[2] thus generates the data output Q[2] and the inverted data output Q[2]' so that each is set equal to the test input TI[2] and the inverted test input TI[2]', respectively. The test input TI[2] and the inverted test input TI[2]' are the data output Q[1] and the inverted data output Q[1]' from the DSFF 12[1] in the SSE 10[1] of the previous pipeline stage 20[1] while the test enable input[3] indicates the scan mode.

Since the clock signal CLK is being held in the second clock state during the scan mode, the SSE 10[2] will be provided in the reset state so as to hold the data output Q[2] and the inverted data output Q[2]' in response to the test enable input TE[3] indicating the normal operational mode. In response to the test enable input TE[3] indicating the scan mode and the differential logical output DLO[2] being provided in the differential output state, the CDC 14[2] is configured to generate the test enable input TE[2] to indicate the scan mode. Accordingly, the CDC 14[2] triggers the SSE 10[1] to operate in the scan mode.

The SSE 10[1] will operate in the scan mode last. However, the CDC 14[1] does not generate the test enable input TE[1] to indicate the scan mode until both the test enable input TE[2] indicates the normal operational mode and the differential logical output DLO[1] is provided in the differential output state. The DSFF 12[1] thus generates the data output Q[1] and the inverted data output Q[1]' so that each is set to equal to the test input TI[1] and the inverted test input TI[1]', respectively. The test input TI[1] is the global test output.

Since the clock signal CLK is being held in the second clock state during the scan mode, the SSE 10[1] will be provided in the reset state so as to hold the data output Q[1] and the inverted data output Q[1]' in response to the test enable input TE[2] indicating the normal operational mode. In response to the test enable input TE[2] indicating the scan mode and the differential logical output DLO[1] being provided in the differential output state, the CDC 14[1] is configured to generate the test enable input TE[1] to indicate the scan mode. Accordingly, the CDC 14[1] indicates that all of the SSE 10[1], SSE 10[2], SSE 10[3] have operated in the scan mode.

Note that a true test bit has only been provided in the SSE 10[1]. However, a serial sequence of logical states representing the test bits may be provided by the test input TI[1] and in the inverted test bit TI[1]' where the serial sequence is as least as great as the number of the pipeline stages 20. While the clock signal CLK is held in the second clock state, the test enable input TE[GI] can be repeatedly provided to indicate the scan mode and then the normal operational mode as many times as needed by the series sequence of logical states representing the test bits. As such, the test enable input TE[GI] can be utilized to coordinate operations asynchronously. In this manner, the SSEs 10 of every pipeline stage 20 obtains one of the logical states originating in the test input TI[1] and in the inverted test bit TI[1]', which are the global signals.

With regard to the normal operational mode, each of the SSEs 10 is synchronized using the clock signal CLK. During the normal operational mode, the clock signal CLK oscillates between a set of clock states. Generally, the set of clock states includes the first clock state and the second clock state, such as a high clock state and a low clock state. The clock signal CLK may thus be provided as a temporal series of clock pulses. The clock signal CLK may provide the temporal series of clock pulses in a standard temporal clock format. Thus, the clock signal CLK in this embodiment is approximately isochronous and has approximately a 50% duty cycle. Accordingly, the clock signal CLK has a substantial time period of oscillation, which defines a temporal duration of each clock cycle. Furthermore, during each clock cycle, the clock signal CLK provides a clock pulse for approximately 50% of the temporal duration of each clock cycle, and thus the clock signal CLK is in the first clock state for approximately 50% of the temporal duration of each clock cycle and in the second clock state for approximately 50% of the temporal duration of each clock cycle.

Each of the SSEs 10[1], 10[2], 10[3] shown in FIG. 2 is configured to be set in the evaluation state in response to the clock signal CLK being in the first clock state and the test enable input TE[2], TE[3], TE[GI] indicating the normal operational mode. As such, the SSEs 10[1], 10[2], 10[3] become transparent to the data input D[1], D[2], D[3] from their respective CL 22[1], 22[2], 22[3]. Thus each of the DSFF 12[1], 12[2], 12[3] is configured to set their respective DLO[1], DLO[2], DLO[3] in the differential output state in accordance with the data input D[1], D[2], D[3] from their respective CL 22[1], 22[2], 22[3]. As such, each of the DSFF 12[1], 12[2], 12[3] is configured to generate their respective data output Q[1], Q[2], Q[3] in accordance with the differential output state of their respective from their respective CL 22[1], 22[2], 22[3].

Next, each of the SSEs 10[1], 10[2], 10[3] shown in FIG. 2 is configured to be set in the reset state in response to the clock signal CLK being in the second clock state and the test enable input TE[2], TE[3], TE[GI] indicating the normal operational mode. As such, the SSEs 10[1], 10[2], 10[3] become opaque to the data input D[1], D[2], D[3] from their respective CL 22[1], 22[2], 22[3]. Instead, each of the DSFF 12[1], 12[2], 12[3] closes and is configured to hold their respective data output Q[1], Q[2], Q[3]. Each of the CLs 22[1], 22[2], 22[3] receives the next logical state from the data output Q[0], Q[1], Q[2] and thereby generate the next logical state of the data input D[1], D[2], D[3] based on the logical state of the data output Q[0], Q[1], Q[2], respectively. However, since each of the DSFF 12[1], 12[2], 12[3] is closed, the respective data output Q[1], Q[2], Q[3] is unaffected by the next logical state of the data input D[1], D[2], D[3]. Instead, each of the DSFF 12[1], 12[2], 12[3] is configured to generate their respective DLO[1], DLO[2], DLO[3] in the precharge state. As such, each of the DSFF 12[1], 12[2], 12[3] is configured to hold the logical state of their respective data output Q[0], Q[1], Q[2].

When the clock signal CLK goes back to the first clock state, the SSEs 10[1], 10[2], 10[3] are again provided in the evaluation state and the process repeats for the next logical state of the data input D[1], D[2], D[3]. As such, the logical state progress through the pipeline circuit 18 from the SSE 10[1] to the SSE 10[2] and then to the SSE 10[3] as the clock signal CLK oscillates through the clock cycles. The operational direction of the pipeline circuit 18 is thus from the SSE 10[1] to the SSE 10[3] in the normal operational mode. Note however, that the operational direction of the pipeline circuit 18 is in reverse from the SSE 10[3] to the SSE 10[1] in the scan mode.

While the pipeline circuit 18 shown in FIG. 2 has three pipeline stages 20[1], 20[2], 20[3], alternative embodiment of the pipeline circuit 18 may have any number of pipeline stages greater than one. Nevertheless, the principles of operation described above with respect to FIG. 2 apply to all of these embodiments.

Figure 3:
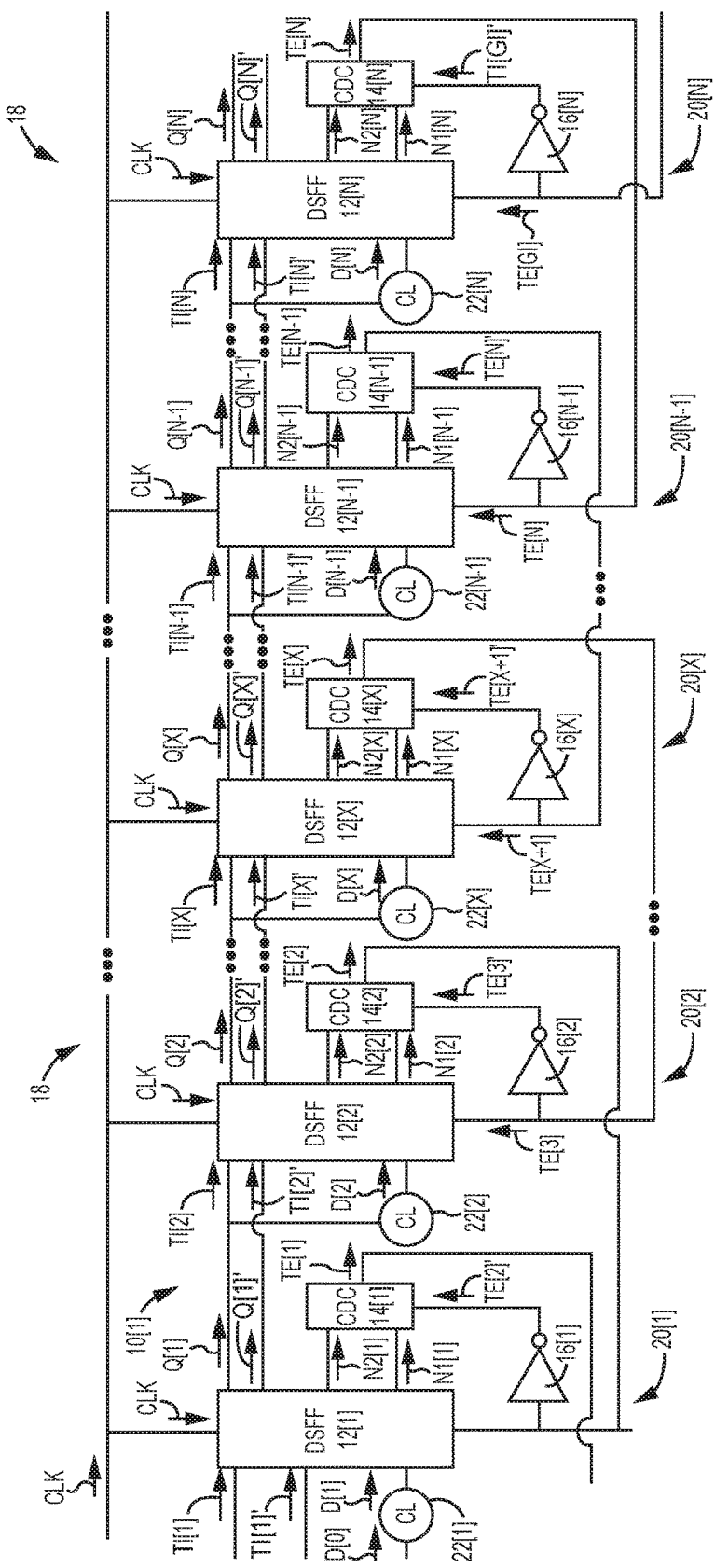
FIG. 3 illustrates a pipeline circuit having a sequence of any integer number N of pipeline stages wherein each of the pipeline stages includes an SSE like the SSE found in FIG. 1.

FIG. 3 illustrates a block diagram of another embodiment of the pipeline circuit 18. In this embodiment, the pipeline circuit 18 has an integer number of pipeline stages greater or equal to five. FIG. 3 specifically illustrates that the pipeline circuit 18 has the pipeline stages 20[1], 20[2], 20[X], 20[N-1] and 20[N] (referred to generically as pipeline stages 20). The pipeline stages 20 shown in FIG. 3 are operate in the normal operational mode from the pipeline stage 20[1] to the pipeline stage 20[N]. In one embodiment, there are exactly five pipeline stages and thus there are no other pipeline stages other than the pipeline stages 20[1], 20[2], 20[X], 20[N-1] and 20[N]. However, in other embodiments, there may be one or more pipeline stages connected sequentially between the pipeline stage 20[2] and the pipeline stage 20[X]. Additionally or alternatively, there may be one or more pipeline stages connected sequentially between the pipeline stage 20[X] and the pipeline stage 20[N-1].

The pipeline stages 20[1], 20[2] shown in FIG. 3 are the same as the pipeline stages 20[1], 20[2] described above with respect to FIG. 2. Thus, the pipeline stage 20[1] is the beginning pipeline stage and the pipeline stage 20[2] is the next pipeline stage after the pipeline stage 20[1]. In this embodiment, the pipeline stage 20[N] is the final pipeline stage. The pipeline stage 20[N-1] is the pipeline stage prior to the pipeline stage 20[N]. Finally, the pipeline stage 20[X] is a pipeline stage between the pipeline stage 20[2] and the pipeline stage 20[N-1]. As with the embodiment described above with respect to FIG. 2, the operational direction in the normal operational mode is from the (beginning) pipelines stage 20[1] to the (final) pipeline stage 20[N] while the operational direction during the scan mode is from the (final) pipeline stage 20[N] to the (beginning) pipeline stage 20[1].

The different pipeline stages 20[1], 20[2], 20[X], 20[N-1] and 20[N] each handle a different operation of the finite state machine so that the various operations of the finite state machine are handled essentially in series. Examples of operations that may be provided by the different pipeline stages 20[1], 20[2], 20[X], 20[N-1] and 20[N] for the finite state machine include instruction fetch operations, instruction decode operations, encode operations, register file operations, fetch operations, instruction execution operations, data memory access operations, register file write back operations, and/or the like. As shown in FIG. 3, each of the pipeline stages 20[1], 20[2], 20[X], 20[N−1] and 20[N] in the pipeline circuit 18 includes a CL (referred to generically as CL 22 and specifically as 22[1], 22[2], 22[X], 22[N−1], and 22[N]) an SSE ((referred to generically as SSE 10 and specifically as SSE 10[1], SSE 10[2], SSE 10[X], SSE 10[N−1] and SSE 10[N])).

In the pipeline circuit 18, the CLs 22[1], 22[2], 22[X], 22[N−1], and 22[N] of the different pipeline stages 20[1], 20[2], 20[X], 20[N−1] and 20[N] are specialized to handle the particular operation of each of the pipeline stages 20[1], 20[2], 20[X], 20[N−1] and 20[N]. Accordingly, for each of the pipeline stages 20[1], 20[2], 20[X], 20[N−1] and 20[N] in the pipeline circuit 18, the CLs include an arrangement of combinational logic elements (i.e., logic gates) configured to provide logic that implements the operation of the pipeline stages 20[1], 20[2], 20[X], 20[N−1] and 20[N]. For example, static combinational elements and/or dynamic combinational elements may be utilized. While the pipeline circuit 18 shown in FIG. 3 has three pipeline stages 20[1], 20[2], 20[X], 20[N−1] and 20[N], it should be noted that the pipeline circuit 18 may include any number of pipeline stages. This may depend on the particular finite state machine to be provided for the particular application. Furthermore, the pipeline circuit 18 shown in FIG. 3 has been simplified for the purposes of describing relevant concepts related to the application. In particular, each of the pipeline stages 20[1], 20[2], 20[X], 20[N−1] and 20[N] is shown having a particular one of the SSE 10[1], SSE 10[2], SSE 10[X], SSE 10[N−1] and SSE 10[N] so that each of the pipeline stages 20[1], 20[2], 20[X], 20[N−1] and 20[N] stores one bit. Obviously, this is generally not the case and each of the pipeline stages 20[1], 20[2], 20[X], 20[N−1] and 20[N] may include various SSEs like the SSE 10[1], the SSE 10[2], and the SSE 10[3] for multi-bit storage. FIG. 3 has however been simplified for the sake of clarity but this arrangement should not and is not intended in any way to limit the scope of the disclosure The SSE 10[1], SSE 10[2], SSE 10[X], SSE 10[N−1] and SSE 10[N] shown in FIG. 3 are each identical to the SSE 10 shown in FIG. 1 and operate in the same fashion as the SSE 10 described in FIG. 1. The pipeline circuit 18 is thus operable in at least the normal operational mode and in the scan mode. To synchronize the pipeline stages 20[1], 20[2], 20[X], 20[N−1] and 20[N] of the pipeline circuit 18 during the normal operational mode, the SSE 10[1], SSE 10[2], SSE 10[X], SSE 10[N−1] and SSE 10[N] coordinate transfer of valid logical states between the different pipeline stages 20[1], 20[2], 20[X], 20[N−1] and 20[N] in accordance with the clock signal CLK, which in this example is the global clock signal provided to each of the pipeline stages 20. Thus, in this particular embodiment, the pipeline circuit 18 is assumed to be arranged in a single-phase clock style so that each of the SSE 10[1], SSE 10[2], SSE 10[X], SSE 10[N−1] and SSE 10[N] in the different pipeline stages 20[1], 20[2], 20[X], 20[N−1] and 20[N] receives the same clock signal CLK. Alternatively, multiple-phase clock styles may be used where different versions of the clock signal CLK are provided having different phases. This may depend, for example, on the particular clock distribution technique used for the pipeline circuit 18. When multiple-phase clock styles are implemented, each of the SSEs 10 in the different pipeline stages 20[1], 20[2], 20[X], 20[N−1] and 20[N] may receive a different version of the clock signal CLK within each of the pipeline circuits 18. Additionally, when the CLs 22 are implemented using dynamic combinational elements, coordination of precharging may be coordinated by different clock signals if desired.

The SSE 10[1], SSE 10[2], SSE 10[X], SSE 10[N−1] and SSE 10[N] are each identical to the SSE 10 and operate in the same fashion as the SSE 10 described in FIG. 1. Note that each of the SSE 10[1], SSE 10[2], SSE 10[X], SSE 10[N−1] and SSE 10[N] include the DSFF 12[1], the DSFF 12[2], a DSFF 12[X], a DSFF 12[N−1] and a DSFF 12[N] (referred to generically as the DSFFs 12, respectively) where each is identical and operates in the same manner as the DSFF 12 shown in FIG. 1 above. Additionally, each of the SSE 10[1], SSE 10[2], SSE 10[X], SSE 10[N−1] and SSE 10[N] include the CDC 14[1], the CDC 14[2], a CDC 14[X], a CDC 14[N−1] and a CDC 14[N] (referred to generically as the CDC 14, respectively) where each is identical and operates in the same manner as the CDC 14 shown in FIG. 1 above. Finally, each of the SSE 10[1], SSE 10[2], SSE 10[X], SSE 10[N−1] and SSE 10[N] include the inverter gate 16[1], the inverter gate 16[2], an inverter gate 16[X], an inverter gate 16[N−1], and a inverter gate 16[N] (referred to generically as the inverter gates 16, respectively) where each is identical and operates in the same manner as the inverter gate 16 shown in FIG. 1 above.

As just mentioned above, each of the SSE 10[1], SSE 10[2], SSE 10[X], SSE 10[N−1] and SSE 10[N] are identical to the SSE 10 shown in FIG. 1. The CLs 22 each receive a data output and generate a data input (referred to generically as the data inputs D and specifically as the data inputs D[1], D[2], D[X], D[N−1], D[N]). Each of the data inputs D[1], D[2], D[X], D[N−1], D[N] is thus analogous to the data input D described above with respect to FIG. 1. For the pipeline stage 20[1], which is the beginning pipeline stage, the data output Q[0] is received by the CL 22[1] from some external circuitry such as a memory system or the like. The CL 22[1] is configured to generate the data input D[1] in accordance with the data output D[0].

Each of the DSFF 12[1], DSFF 12[2], DSFF 12[X], DSFF 12[N−1], DSFF 12[N] is configured to generate a corresponding data output (referred to generically as data outputs Q and specifically as data outputs Q[1], Q[2], Q[X], Q[N−1], Q[N]) and a corresponding inverted data output (referred to generically as data outputs Q' and specifically as data outputs Q[1]', Q[2]', Q[X]', Q[N−1]', Q[N]') in the same manner as the DSFF 12 described above with respect to the data output Q and the inverted data output Q' shown in FIG. 1.

For the subsequent pipeline stages 20[2], 20[X], 20[N−1], and 20[N] in the pipeline circuit 18 after the pipeline stage 20[1], each of the CLs 22[2], 22[X], 22[N−1] and 22[N] are configured to receive the data output Q[1], Q[2] from the previous pipeline stage 20[1], 20[2], 20[X−1], and 20[N−1], respectively. Each of the CLs 22[2], 22[X], 22[N−1] and 22[N] are thus configured to generate their corresponding data input D[2], D[X], D[N−1], D[N] from the corresponding data output Q[1], Q[2], Q[X−1], Q[N−1] of the DSFF 12[1], DSFF 12[2], DSFF 12[X−1], DSFF 12[N−1] of the corresponding previous pipeline stage 20[1], 20[2], 20[X−1], and 20[N−1]. However, assuming that the pipeline stage 20[N] is the final pipeline stage, the DSFF 12[N] does not provide the data output Q[N] to a subsequent pipeline stage but rather the data output Q[N] may be considered the global data output resulting from the computation provided by the pipeline circuit 18.

Each of the DSFF 12[2], DSFF 12[X], DSFF 12[N−1], DSFF 12[N], DSFF 12[N] is configured to generate a corresponding differential logical output (referred to generically as the differential logical outputs DLO and specifically as the differential logical outputs DLO[1], DLO[2], DLO[X], DLO[N−1], DLO[N]). Thus, each of the DSFF 12[2], DSFF 12[X], DSFF 12[N−1], DSFF 12[N], DSFF 12[N] is configured to generate a corresponding first logical output (referred to generically as the first logical outputs N1 and specifically as the first logical outputs N1[1], N1[2], N1[X], N1[N−1], N1[N]) to generate a corresponding second logical output (referred to generically as the second logical outputs N2 and specifically as the second logical outputs N2[1], N2[2], N2[X], N2[N−1], N2[N]) in the same manner described above with DSFF 12 shown in FIG. 1.

Thus, each of the CDC 14[1], CDC 14[2], CDC 14[X], CDC 14[N−1], and CDC 14[N] is configured to receive the differential logical output DLO[1], DLO[2], DLO[X], DLO[N−1], DLO[N] from the DSFF 12[2], DSFF 12[X], DSFF 12[N−1], DSFF 12[N], DSFF 12[N] in its corresponding pipeline stage 20[1], 20[2], 20[X], 20[N−1] and 20[N]. Furthermore, each of the CDC 14[1], CDC 14[2], CDC 14[X], CDC 14[N−1], and CDC 14[N] is configured to generate a corresponding test enable input (referred to generically as test enable input TE and specifically as test enable inputs TE[1], TE[2], TE[X], TE[N−1], TE[N]) in the same manner described above with respect to the CDC 14 shown in FIG. 1. Thus, for each of the pipeline stages 20[1], 20[2], 20[X], 20[N−1] and 20[N], the respective test enable input TE[1], TE[2], TE[X], TE[N−1], TE[N] corresponds with the test enable input TE[I] described above with respect to FIG. 1.

For the pipeline stages 20[1], 20[2], 20[X], 20[N−1] in the pipeline circuit 18 before the pipeline stage 20[N], each of the DSFF 12[2], DSFF 12[X], DSFF 12[N−1], DSFF 12[N] are configured to receive the test enable input TE[2], TE[N], TE[X+1], TE[N] from the subsequent pipeline stages 20[2], 20[X], 20[N−1], and 20[N], respectively. Thus, for each of the pipeline stages 20[1], 20[2], 20[X], 20[N−1] the test enable input TE[E] described above with respect to FIG. 1 corresponds to the test enable input TE[2], TE[3], TE[X+1], TE[N] from the subsequent pipeline stages 20[2], 20[X], 20[N−1], and 20[N]. The pipeline stage 20[N] is the final pipeline stage, the DSFF 12[N] is configured to receive a test enable input TE[GI], which is the global test enable input. Thus, for the pipeline stage 20[N], the test enable input TE[GI] corresponds with the test enable input TE[E] described above with respect to FIG. 1. Furthermore, the CDC 14[1] is configured to provide the test enable input TE[1] to external circuitry to indicate that all of the SSEs 10 has registered a test input. Each of the inverter gate 16[1], inverter gate 16[2], inverter gate 16[X], inverter gate 16[N−1] and inverter gate 16[N] is configured to generate a corresponding inverted test enable input (referred to generically as inverted test enable inputs TE and specifically as inverted test enable inputs TE[2]', TE[3]', TE[X+1]', TE[N]', TE[GI]') in the same manner as the inverter gate 16 described above with respect to the inverted test enable input TE[E]' shown in FIG. 1.

The pipeline stage 20[1] as the beginning pipeline stage is operable to receive the test input TI[1] and the inverted test input TI[1]', which in this example are the global test input and an inverted global test input respectively. With regard to FIG. 1, the test input TI[1] and the inverted test input TI[1]' correspond to the test input TI and the inverted test input TI' described above with respect to FIG. 1. For the subsequent pipeline stages 20[2], 20[X], 20[N−1], and 20[N] in the pipeline circuit 18 after the pipeline stage 20[1], each of DSFF 12[2], DSFF 12[X], DSFF 12[N−1], DSFF 12[N] are configured to receive the data output Q[1], Q[2], Q[X−1], Q[N−1] from the previous pipeline stage 20[1], 20[X−1], 20[N−2], 20[N−1], respectively as the test input TI[2], TI[X], TI[N−1], TI[N] for the pipeline stage 20[2], 20[X], 20[N−1], and 20[N]. The data output Q[1], Q[2], Q[X−1], Q[N−1] and thus correspond with the test input TI described above with respect to FIG. 1. Also, for the subsequent pipeline stages 20[2], 20[X], 20[N−1], and 20[N] in the pipeline circuit 18 after the pipeline stage 20[1], each of DSFF 12[2], DSFF 12[X], DSFF 12[N−1], DSFF 12[N] are configured to receive the inverted data output Q[1]', Q[X−1]', Q[N−2]', Q[N−1]' from the previous pipeline stage 20[1], 20[X−1], 20[N−2], 20[N−1], respectively as an inverted test input TI[2]', TI[X]', TI[N−1]', TI[N]' for the pipeline stage 20[2], 20[X], 20[N−1], and 20[N]. The inverted data output Q[1]', Q[2]', Q[X−1]', Q[N−1]' and thus the inverted test input TI[2]', TI[X]', TI[N−1]', TI[N]' correspond with the inverted test input TI' described above with respect to FIG. 1.

In the subsequent pipeline stages 20[2], 20[X], 20[N−1], and 20[N] in the pipeline circuit 18 after the pipeline stage 20[1], each of DSFF 12[2], DSFF 12[X], DSFF 12[N−1], DSFF 12[N] are configured to receive the data output Q[1], Q[2], Q[X−1], Q[N−1] (as a test input TI[2], TI[X], TI[N−1], TI[N]) from the previous pipeline stage 20[1], 20[X−1], 20[N−2], 20[N−1]. For the pipeline stage 20[2], 20[X], 20[N−1], and 20[N], each of the data the test inputs TI[2], TI[X], TI[N−1], TI[N] correspond with the test input TI described above with respect to FIG. 1. Also, for the subsequent pipeline stages 20[2], 20[X], 20[N−1], and 20[N] in the pipeline circuit 18 after the pipeline stage 20[1], each of DSFF 12[2], DSFF 12[X], DSFF 12[N−1], DSFF 12[N] are configured to receive the inverted data output Q[1]', Q[2]', Q[X−1]', Q[N−1]' (as a test input TI[2], TI[X], TI[N−1], TI[N]) from the previous pipeline stage 20[1], 20[X−1], 20[N−2], 20[N−1] (thus also the inverted test input TI[2]', TI[X]', TI[N−1]', TI[N]')]. For the subsequent pipeline stages 20[2], 20[X], 20[N−1], and 20[N], each of the inverted test input TI[2]', TI[X]', TI[N−1]', TI[N]' correspond with the inverted test input TI' described above with respect to FIG. 1.

Note that the test input TI[1] and the inverted test input TI[1]' are the (non-inverted/inverted) global test inputs that are received by the DSFF 12[1], which is the beginning pipeline stage 20[1]. Thus, the SSE 10[N] will operate in the scan mode first. However, the CDC 14[N] does not generate the test enable input TE[N] to indicate the scan mode until both the test enable input TE[GI] indicates the normal operational mode and the differential logical output DLO[N] is provided in the differential output state. The DSFF 12[N] thus generates the data output Q[N] and the inverted data output Q[N]' so that each is set to equal to the test input TI[N] and the inverted test input TI[N]', respectively. The test input TI[N] and the inverted test input TI[N]' are the data output Q[N−1] and the inverted data output Q[N−1]' from the DSFF 12[N−1] in the SSE 10[N−1] of the previous pipeline stage 20(2) while the test enable input[GI] indicates the scan mode. Since the clock signal CLK is being held in the second clock state during the scan mode, the SSE 10[N] will be provided in the reset state so as to hold the data output Q[N] and the inverted data output Q[N]' in response to the test enable input TE[GI] indicating the normal operational mode. In response to the test enable input TE[GI] indicating the scan mode and the differential logical output DLO[N] being provided in the differential output state, the CDC 14[N] is configured to generate the test enable input TE[N] to indicate the scan mode. Accordingly, the CDC 14[N] triggers the SSE 10[N−1] to operate in the scan mode.

The SSE 10[N−1] will operate in the scan mode second. However, the CDC 14[N−1] does not generate the test enable input TE[N−1] to indicate the scan mode until both the test enable input TE[N] indicates the normal operational mode and the differential logical output DLO[N−1] is provided in the differential output state. The DSFF 12[N−1] thus generates the data output Q[N−1] and the inverted data output Q[N−1]' so that each is set to equal to the test input TI[N−1] and the inverted test input TI[N−1]', respectively. The test input TI[N−1] and the inverted test input TI[N−1]' are the data output Q[N−2] and the inverted data output Q[N−2]' from the DSFF 12[N−2] in the SSE 10[N−2] of the previous pipeline stage 20(2) while the test enable input[N] indicates the scan mode. Since the clock signal CLK is being held in the second clock state during the scan mode, the SSE 10[N−1] will be provided in the reset state so as to hold the data output Q[N−1] and the inverted data output Q[N−1]' in response to the test enable input TE[N] indicating the normal operational mode. In response to the test enable input TE[N] indicating the scan mode and the differential logical output DLO[N−1] being provided in the differential output state, the CDC 14[N−1] is configured to generate the test enable input TE[N−1] to indicate the scan mode. Accordingly, the CDC 14[N−1] triggers the SSE 10[N−2] to operate in the scan mode.

The SSE 10[X] will operate in the scan mode after the SSE 10[N−2]. However, the CDC 14[X] does not generate the test enable input TE[X] to indicate the scan mode until both the test enable input TE[X+1] indicates the normal operational mode and the differential logical output DLO[X] is provided in the differential output state. The DSFF 12[X] thus generates the data output Q[X] and the inverted data output Q[X]' so that each is set to equal to the test input TI[X] and the inverted test input TI[X]', respectively. The test input TI[X] and the inverted test input TI[X]' are the data output Q[X−1] and the inverted data output Q[X−1]' from the DSFF 12[X−1] in the SSE 10[X−1] of the previous pipeline stage 20(2) while the test enable input[X+1] indicates the scan mode. Since the clock signal CLK is being held in the second clock state during the scan mode, the SSE 10[X] will be provided in the reset state so as to hold the data output Q[X] and the inverted data output Q[X]' in response to the test enable input TE[X+1] indicating the normal operational mode. In response to the test enable input TE[X+1] indicating the scan mode and the differential logical output DLO[X] being provided in the differential output state, the CDC 14[X] is configured to generate the test enable input TE[X] to indicate the scan mode. Accordingly, the CDC 14[X] triggers the SSE 10[X−1] to operate in the scan mode.

Note that a true test bit has only been provided in the SSE 10[1]. However, a serial sequence of logical states representing the test bits may be provided by the test input TI[1] and in the inverted test bit TI[1]' where the serial sequence is as least as great as the number of the pipeline stages 20. While the clock signal CLK is held in the second clock state, the test enable input TE[GI] can be repeatedly provided to indicate the scan mode and then the normal operational mode as many times as needed by the series sequence of logical states representing the test bits. As such, the test enable input TE[GI] can be utilized to coordinate operations asynchronously. In this manner, the SSEs 10 of every pipeline stage 20 obtains one of the logical states originating in the test input TI[1] and in the inverted test bit TI[1]', which are the global signals.

With regard to the normal operational mode, each of the SSEs 10 is synchronized using the clock signal CLK. During the normal operational mode, the clock signal CLK oscillates between a set of clock states. Generally, the set of clock states includes the first clock state and the second clock state, such as a high clock state and a low clock state. The clock signal CLK may thus be provided as a temporal series of clock pulses. The clock signal CLK may provide the temporal series of clock pulses in a standard temporal clock format. Thus, the clock signal CLK in this embodiment is approximately isochronous and has approximately a 50% duty cycle. Accordingly, the clock signal CLK has a substantial time period of oscillation, which defines a temporal duration of each clock cycle. Furthermore, during each clock cycle, the clock signal CLK provides a clock pulse for approximately 50% of the temporal duration of each clock cycle, and thus the clock signal CLK is in the first clock state for approximately 50% of the temporal duration of each clock cycle and in the second clock state for approximately 50% of the temporal duration of each clock cycle.

Each of the SSE 10[1], SSE 10[2], SSE 10[X], SSE 10[N−1] and SSE 10[N] shown in FIG. 3 is configured to be set in the evaluation state in response to the clock signal CLK being in the first clock state and the test enable input TE[2], TE[3], TE[X+1], TE[N], TI[GI] indicating the normal operational mode. As such, the SSE 10[1], SSE 10[2], SSE 10[X], SSE 10[N−1] and SSE 10[N] become transparent to the data input D[1], D[2], D[X], D[N−1], D[N] from their respective CL 22[1], 22[2], 22[X], 22[N−1] and 22[N]. Thus each of the DSFF 12[1], 12[2], 12[3] is configured to set their respective DLO[1], DLO[2], DLO[X], DLO[N−1], DLO[N] in the differential output state in accordance with the data input D[1], D[2], D[X], D[N−1], D[N] from their respective CL 22[1], 22[2], 22[X], 22[N−1] and 22[N]. As such, each of the DSFF 12[1], DSFF 12[2], DSFF 12[X], DSFF 12[N−1], DSFF 12[N] is configured to generate their respective data output Q[1], Q[2], Q[X], Q[N−1], Q[N] in accordance with the differential output state of their respective from their respective CL 22[1], 22[2], 22[X], 22[N−1] and 22[N].

Next, each of the SSE 10[1], SSE 10[2], SSE 10[X], SSE 10[N−1] and SSE 10[N] shown in FIG. 3 is configured to be set in the reset state in response to the clock signal CLK being in the second clock state and the test enable input TE[2], TE[3], TE[X+1], TE[N], TI[GI] indicating the normal operational mode. As such, the SSE 10[1], SSE 10[2], SSE 10[X], SSE 10[N−1] and SSE 10[N] become opaque to the data input D[1], D[2], D[X], D[N−1], D[N] from their respective CL 22[1], 22[2], 22[X], 22[N−1] and 22[N]. Instead, each of the DSFF 12[1], DSFF 12[2], DSFF 12[X], DSFF 12[N−1], DSFF 12[N] closes and is configured to hold their respective data output Q[1], Q[2], Q[X], Q[N−1], Q[N]. Each of the CLs 22[1], 22[2], 22[X], 22[N−1] and 22[N] receives the next logical state from the data output Q[0], Q[1], Q[X−1], Q[N−1], Q[X−1], Q[N−1] and thereby generate the next logical state of the data input D[1], D[2], D[X], D[N−1], D[N] based on the logical state of the data output Q[0], Q[1], Q[X−1], Q[N−1], respectively. However, since each of the DSFF 12[1], DSFF 12[2], DSFF 12[X], DSFF 12[N−1], DSFF 12[N] is closed, the respective data output Q[1], Q[2], Q[X], Q[N−1], Q[N] is unaffected by the next logical state of the data input D[1], D[2], D[X], D[N−1], D[N]. Instead, each of the DSFF 12[1], DSFF 12[2], DSFF 12[X], DSFF 12[N−1], DSFF 12[N] is configured to generate their respective DLO[1], DLO[2], DLO[X], DLO[N−1], DLO[N] in the precharge state. As such, each of the DSFF 12[1], 12[2], 12[3] is configured to hold the logical state of their respective data output Q[1], Q[2], Q[X], Q[N−1], Q[N].

When the clock signal CLK goes back to the first clock state, the SSE 10[1], SSE 10[2], SSE 10[X], SSE 10[N−1] and SSE 10[N] are again provided in the evaluation state and the process repeats for the next logical state of the data input D[1], D[2], D[X], D[N−1], D[N]. As such, the logical state progress through the pipeline circuit 18 from the SSE 10[1] to the SSE 10[2] to SSE 10[X] to the SSE 10[N−1] to the SSE 10[N] as the clock signal CLK oscillates through the clock cycles. The operational direction of the pipeline circuit 18 is thus from the SSE 10[1] to the SSE 10[N] in the normal operational mode. Note however, that the operational direction of the pipeline circuit 18 is in reverse from the SSE 10[N] to the SSE 10[1] in the scan mode.

Figure 4:
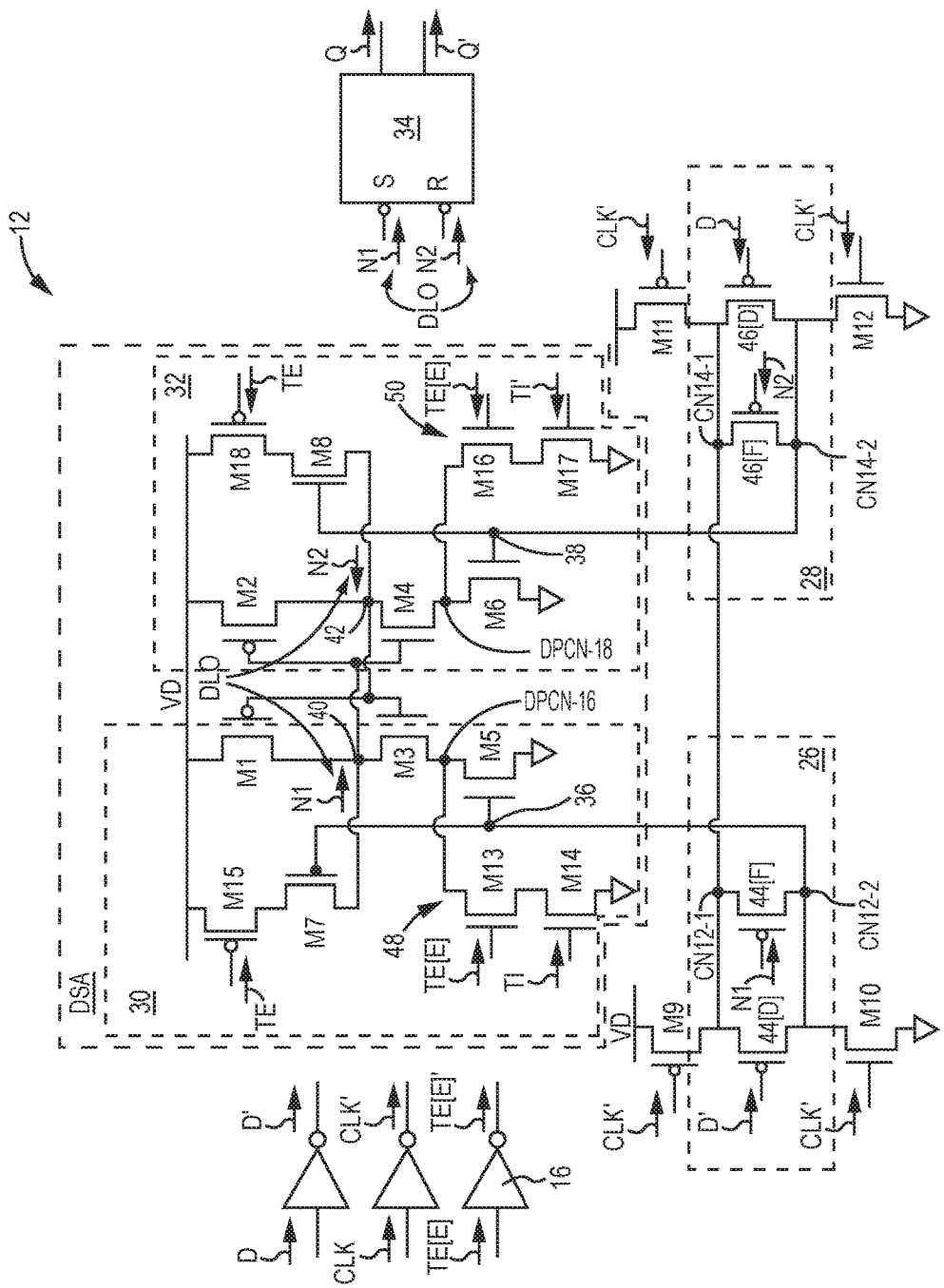
FIG. 4 illustrates an exemplary circuit diagram of one embodiment of the DSFF shown in FIG. 1.

FIG. 4 illustrates an exemplary circuit diagram of the DSFF 12 shown in FIG. 1. Each DSFF 12 shown in FIGS. 2 and 3 may be provided in the same manner as the DSFF 12 shown in FIG. 4. In general, the DSFF 12 includes a first input gate network 26, a second input gate network 28, and a differential sense amplifier DSA formed by a first amplifier branch 30 and a second amplifier branch 32. In this embodiment, the DSFF 12 includes a SR latch 34 configured to generate a data output Q and an inverted data output Q' in accordance with the first logical output N1 and the second logical output N2 from the DSFF 12. The inverted data output Q' is an inversion of the data output Q. As discussed in further detail below, the first input gate network 26 includes a pair of parallel transmission gates.

The first input gate network 26 and the second input gate network 28 are implemented as a transmission gate network. In the illustrated embodiment, the first input gate network 26 is formed by a pair of transmission gates 44[D], 44[F] (referred to generically as transmission gates 44) connected in parallel branches of the first input gate network 26. In this embodiment, each of the transmission gates 44 is a PFET (such as a PMOS) and has a source coupled to the common node CN12-1 and thus the drain of the transistor M9. Each of the transmission gates 44 also has a drain coupled to the common node CN12-2 and thus the drain of the transistor M19. In this embodiment, a gate of the transmission gate 44[D] is operable to receive an inverted data input D'. A gate of the transmission gate 44[F] is configured to receive the first logical output N1 as feedback from the DSA.

Likewise, the second input gate network 28 includes a pair of transmission gates 46[D], 46[F] (referred to generically as transmission gates 46) connected in a parallel branches of the second input gate network 28. In this embodiment, each of the transmission gates 46 is a PFET (such as a PMOS) and has a source coupled to the common node CN14-1 and thus the drain of the transistor M11. Each of the transmission gates 46 also has a drain coupled to the common node CN14-2 and thus the drain of the transistor M12. In this embodiment, a gate of the transmission gate 46[D] is operable to receive the data input D. A gate of the transmission gate 46[F] is configured to receive the second logical output N2 as feedback from the DSA.

Accordingly, the differential sense amplifier DSA is configured to feedback a differential logical output DLO generated by the DSA to the first input gate network 26 and the second input gate network 28. By providing the differential logical output DLO as feedback to the first input gate network 26 and the second input gate network 28, the differential logical output DLO is prevented from floating.

The first amplifier branch 30 includes an isolated control node 36 operably associated with the first input gate network 26 and the second amplifier branch 32 includes an isolated control node 38 operably associated with the second input gate network 28. Furthermore, the first amplifier branch 30 includes an output node 40 coupled to the SR latch 34 while the second amplifier branch 32 includes an output node 42 coupled to the SR latch 34.

With regards to the first input gate network 26, the first input gate network 26 is driven by the first set of logical signals (i.e., the first set of logical inputs x and the first logical output N1). The first input gate network 26 is configured to drive the isolated control node 36 of the first amplifier branch 30 based on the first set of logical signals. More specifically, the first input gate network 26 is configured to charge the isolated control node 36 based on the transmission gate 44[D] being activated by the inverted data input D' being at logical state of "0", as described in further detail below. As such, the first amplifier branch 30 is configured to generate a first logical output N1 of the differential logical output DLO at the output node 40 when the transmission gate 44[D] in the first input gate network 26 is activated by the inverted data input D' being at logical state of "0."

With regards to the second input gate network 28, the second input gate network 28 is driven by the second set of logical signals (i.e., the second set of logical inputs y and the second logical output N2). The second input gate network 28 is configured to drive the isolated control node 38 of the second amplifier branch 32 based on the second set of logical signals. More specifically, the second input gate network 28 is configured to charge the isolated control node 38 when the transmission gate 46[D] is activated by the data input D being at logical state of "0," as described in further detail below. As such, the second amplifier branch 32 is configured to generate a second logical output N2 of the differential logical output DLO at the output node 42 based on the data input D.

The differential sense amplifier DSA is configured to generate the differential logical output DLO in accordance with the data input D and the inverted data input D'. The inverted data input D' is an inversion of the data input D. In this embodiment, the differential sense amplifier DSA is formed by transistors M1-M8. More specifically, the first amplifier branch 30 is formed by transistors M1, M3, M5, and M7 connected as shown. Likewise, the second amplifier branch 32 is formed by transistors M2, M4, M6, and M8 connected as shown. The SR latch 34 has a first input terminal S connected to an output node 40 of the first amplifier branch 30 and a second input terminal R connected to an output node 42 of the second amplifier branch 32. Based on the differential logical output DLO at the output nodes 40 and 42, the SR latch 34 operates to provide a data output Q and an inverted data output Q', which is inverted with respect to the data output Q.

To time the operation of the SSE 10, a transistor M9 and a transistor M10 are each coupled to the first input gate network 26. Both the transistor M9 and the transistor M10 are configured so as to receive an inverted clock signal CLK', which is an inverse of a non-inverted clock signal CLK. Furthermore, a transistor M11 and a transistor M12 are each coupled to the second input gate network 28. The transistor M11 and the transistor M12 are also each configured so as to receive the inverted clock signal CLK'. Each of the transistors M1 through M12 is a field effect transistor (FET), such as a Complementary Metal-Oxide-Semiconductor (CMOS) transistor. However, the present invention is not limited thereto and other types of transistors, such as other types of FETs, may be utilized.

With respect to the first amplifier branch 30, each of the transistors M1, M7 is a P-channel field effect transistor (PFET). Each of the transistors M1, M7 also has a source coupled to receive a supply voltage VD and a drain coupled to the output node 40. A gate of the transistor M1 is coupled to the output node 42 of the second amplifier branch 32 and is thus configured to receive the logical output N2 from the second amplifier branch 32. A gate of the transistor M7 is coupled to the isolated control node 36. Thus, the transistors M1, M7 are each configured to drive the output node 40 near a DC voltage level of the supply voltage VD when activated. As such, the transistors M1, M7 drive the logical output N1 at the output node 40 to a logical state of "1" when activated, as explained in further detail below. Each of the transistors M3, M5 is an N-channel field effect transistor (NFET). A drain of the transistor M3 is coupled to the output node 40, and a source of the transistor M3 is coupled to a drain of the transistor M5. A source of the transistor M5 is coupled to ground. Accordingly, the transistor M3 and the transistor M5 form a discharge path between the output node 40 and ground. When either or both of the transistor M3 or the transistor M5 are deactivated, the discharge path is opened. However, when both the transistors M3,M5 are activated the discharge path is closed. As such, the output node 40 is discharged and pulled near ground. Accordingly, the transistors M3, M5 drive the logical output N1 to a logical state of "0" when activated.

In this embodiment, the gate of the transistor M3 is coupled to the output node 42 of the second amplifier branch 32 and is thus also configured to receive the logical output N2 from the second amplifier branch 32. A gate of the transistor M5 is coupled to the isolated control node 36. In this manner, the first amplifier branch 30 forms a first NAND gate, where the isolated control node 36 can be considered an input node and the gate of the transistor M1 can be considered as another input node. The output node 40 provides the output node of the first NAND gate.

With regard to the transistor M9 coupled to the first input gate network 26, the transistor M9 is a PFET. A source of the transistor M9 receives the supply voltage VD. A drain of the transistor M9 is coupled to a common node CN12-1 of the first input gate network 26. A gate of the transistor M9 is coupled to receive the inverted clock signal CLK'.

With regard to the transistor M10 coupled to the first input gate network 26, the transistor M10 is an NFET. A drain of the transistor M10 is coupled to a common node CN12-2 of the first input gate network 26. The common node CN12-2 is coupled to the isolated control node 36 of the first amplifier branch 30 and thus also to the gate of the transistor M5 and the gate of the transistor M7. A source of the transistor M10 is coupled to ground. A gate of the transistor M10 is coupled to receive the inverted clock signal CLK'.

With respect to the second amplifier branch 32, each of the transistors M2, M8 is a PFET. Each of the transistors M2, M8 also has a source coupled to receive the supply voltage VD and a drain coupled to the output node 42. A gate of the transistor M2 is coupled to the output node 40 of the first amplifier branch 30 and is thus configured to receive the first logical output N1 from the first amplifier branch 30. A gate of the transistor M8 is coupled to the isolated control node 38. Thus, the transistors M2, M8 are each configured to drive the output node 42 near the DC voltage level of the supply voltage VD when activated. As such, the transistors M2, M8 drive the logical output N2 at the output node 42 to a logical state of "1" when activated, as explained in further detail below. Each of the transistors M4, M6 is a NFET. A drain of the transistor M4 is coupled to the output node 42 and a source of the transistor M4 is coupled to a drain of the transistor M6. A source of the transistor M6 is coupled to ground. Accordingly, the transistor M4 and the transistor M6 form a discharge path between the output node 42 and ground. When either or both of the transistor M4 or the transistor M6 are deactivated, the discharge path is opened. However, when both the transistors M5, M6 are activated the discharge path is closed. As such, the output node 42 is discharged and pulled near ground. Accordingly, the transistors M3, M5 drive the logical output N2 to a logical state of "0" when activated.

The gate of the transistor M4 is coupled to the output node 40 of the first amplifier branch 30 and is thus also configured to receive the logical output N1 from the first amplifier branch 30. The gate of the transistor M6 is coupled to the isolated control node 38. In this manner, the second amplifier branch 32 forms a second NAND gate, where the isolated control node 38 can be considered an input node, and the gate of the transistor M2 can be considered as another input node. The output node 42 provides the output node of the second NAND gate. As such, the first NAND gate (i.e., in this embodiment, the first amplifier branch 30) and the second NAND gate (i.e., in this embodiment, the second amplifier branch 32) that form the differential sense amplifier DSA are cross-coupled NAND gates.

With regard to the transistor M11 coupled to the second input gate network 28, the transistor M11 is a PFET. A source of the transistor M11 receives the supply voltage VD. A drain of the transistor M11 is coupled to a common node CN14-1 of the second input gate network 28. A gate of the transistor M11 is coupled to receive the inverted clock signal CLK'.

With regard to the transistor M12 coupled to the second input gate network 28, the transistor M12 is an NFET. A drain of the transistor M12 is coupled to a common node CN14-2 of the second input gate network 28. The common node CN14-2 is coupled to the isolated control node 38 of the second amplifier branch 32 and thus also to the gate of the transistor M6 and the gate of the transistor M8. A source of the transistor M12 is coupled to ground. A gate of the transistor M12 is coupled to receive the inverted clock signal CLK'.

During a normal operational mode, the DSFF 12 of FIG. 4 operable in a reset state and an evaluation state. The DSFF 12 cycles through the reset state and the evaluation state during the normal operational mode in accordance with the non-inverted clock signal CLK and the inverted clock signal CLK'. More specifically, in order to enter the reset state, the non-inverted clock signal CLK is set to a voltage level corresponding to a logical state of "0," and therefore the inverted clock signal CLK' is set to a voltage level corresponding to a logical state of "1." As a result, the transistor M10 and the transistor M12 are both activated, and the transistor M9 and the transistor M11 are both deactivated. Therefore, the isolated control node 36 is discharged through transistor M10, and the isolated control node 38 is discharged through the transistor M12. Accordingly, the isolated control node 36 and the isolated control node 38 are each pulled near ground and provided at logical state of "0." Also, since the transistor M10 and the transistor M12 are both activated, and the transistor M9 and the transistor M11 are both deactivated, the transmission gate 44[D] in the first input gate network 26 are deactivated during the reset state.

When the isolated control node 36 and the isolated control node 38 of the first amplifier branch 30 and the second amplifier branch 32, respectively are pulled to logical state of "0," the transistors M7 and M8 are activated, and the transistors M5 and M6 are deactivated. The discharge path formed by the transistors M3, M5 in the first amplifier branch 30 and the discharge path formed by the transistors M4, M6 in the second amplifier branch 32 are thus both open. The output nodes 40, 42 are prevented from being discharged in the reset state. Furthermore, the transistors M7 is configured to pull the output node 40 of the first amplifier branch 30 near the DC supply voltage level of the supply voltage VD in response to the isolated control node 36 being near ground and at a logical state of "0." Accordingly, the first logical output N1 is provided at a logic "1" since the output node 40 is charged to a high voltage state (i.e., near a DC voltage magnitude of the supply voltage VD) during the reset state. Likewise, and the transistor M8 is configured to pull the output node 42 of the second amplifier branch 32 near the DC supply voltage level of the supply voltage VD in response to the isolated control node 38 being near ground and at a logical state of "0." Thus, the second logical output N2 is also provided at logic "1" since the output node 42 is charged to a high voltage state (i.e., near a DC voltage magnitude of the supply voltage VD) during the reset state. The differential logical output DLO is thus set to a precharge state of "1/1" during the reset state of the TLE. Once the reset state is complete, the transistors M1, M2, M3, M4, M5, and M6 are deactivated, and the remaining transistors, M7, and M8 are activated. At this point, the DSFF 12 is primed for evaluation.

On the rising edge of the non-inverted clock signal CLK and falling edge of the inverted clock signal CLK', the DSFF 12 transitions to the evaluation state. The DSFF 12 is maintained in the evaluation state while the non-inverted clock signal CLK is a logic "1" and the inverted clock signal CLK' is a logical state of "0." The differential sense amplifier DSA is configured to set one of the logical outputs N1, N2 to a logic "0" and maintain the other one of the logical outputs N2, N1 at a logic "1" during the evaluation state. More specifically, the differential sense amplifier DSA is configured to discharge one of the output nodes 40, 42 to a low voltage state (i.e. logic "0") and prevent the discharge of the other one of the output nodes 42, 40 so as to maintain the other one of the output nodes in the high voltage state (logic "1") during the evaluation state. The differential logical output DLO is thus provided in either a first differential output state (e.g., "1/0") or in a second differential output state (e.g., "0/1") opposite the second differential output state during the evaluation state. This may result in a transition in data output Q and data output Q' of the SR latch 34.

More specifically, as the non-inverted clock signal CLK rises and the inverted clock signal CLK' falls; a current race begins between the first amplifier branch 16 and the second amplifier branch 32. During the evaluation state, the transistor M10 and the transistor M12 are both deactivated, and the transistor M9 and the transistor M11 are both activated. The transistor M10 and the transistor M12 therefore prevent the isolated control node 36 and the isolated control node 38 from being discharged through the transistor M10 and the transistor M12, respectively. Furthermore, the transistor M9 and the transistor M10 pull the common node CN12-1 and the common node CN14-1 near the DC supply voltage level of the supply voltage VD. Accordingly, the transmission gates in the first input gate network 26 are operable to be activated based on the first set of logical signals and the transmission gates in the second input gate network 28 are operable to be activated based on the set of logical signals during the evaluation state.

The differential sense amplifier DSA is operably associated with the first input gate network 26 and the second input gate network 28 such that the first amplifier branch 30 wins the current race when the transmission gate 44[D] is activated by the inverted data input D being at logical state of "0," and the transmission gate 46[D] is deactivated by the data input D being a logical state of "1." In this case, a conductance of the first input gate network 26 is greater than a conductance of the second input gate network 28. Furthermore, the differential sense amplifier DSA is operably associated with the first input gate network 26 and the second input gate network 28 such that the second amplifier branch 32 wins the current race when the transmission gate 44[D] is deactivated by the inverted data input D being at logical state of "1," and the transmission gate 46[D] is activated by the data input D being a logical state of "0." In this case, the conductance of the second input gate network 28 is greater than a conductance of the first input gate network 26.

More specifically, the first amplifier branch 30 wins the current race if the first input gate network 26 charges the isolated control node 36 of the first amplifier branch 30 to a voltage level sufficient (i.e. a logic "1") to activate the transistor M5 and deactivate the transistor M7 before the second input gate network 28 charges the isolated control node 38 of the second amplifier branch to a voltage level (i.e. a logic "1") sufficient to activate the transistor M6 and deactivate the transistor M8. Note that the gate of the transistor M3 is coupled to the output node 42 so as to receive the logical output N2 as feedback from the second amplifier branch 32. Additionally, the gate of the transistor M4 is coupled to the output node 40 so as to receive the logical output N1 as feedback from the first amplifier branch 30 Since both the logical outputs N1, N2 where set to logic "1" during the reset state, the gates of both the transistors M3, M4 initially receive a logic "1" at the beginning of the evaluation state. Furthermore, the gate of the transistor M7 is coupled to the isolated control node 36 and the gate of the transistor M8 is coupled to the isolated control node 38. Accordingly, the isolated control node 36, 38 that is provided at logic "1" fastest will result in either the transistor M7 or the transistor M8 being deactivated and either the transistors M3, M5 or the transistors M4, M6 being activated. If the transistors M3, M5 are activated, the discharge path formed by the transistors M3, M5 is closed and the output node 40 is discharged. Accordingly, the logical output N1 is provided at logical state of "0." In response, the transistor M2 is activated to maintain the output node 42 and the logical output N2 at logical state of "1." If the transistors M4, M6 are activated, the discharge path formed by the transistors M4, M6 is closed and the output node 42 is discharged. Accordingly, the logical output N2 is provided at logical state of "0." In response, the transistor M1 is activated to maintain the output node 40 and the logical output N1 at logical state of "1."

More specifically, the first amplifier branch 30 wins the current race if the transmission gate 44[D] is activated by the inverted data output D' being in the logical state "0." In this case, due to a conductance of the first input gate network 26 being higher than a conductance of the second input gate network 28, the isolated control node 36 starts to charge before the isolated control node 38. Accordingly, the isolated control node 36 activates the transistor M5 and deactivates the transistor M7. As a result, the output node 40 starts to discharge through the transistor M3 and the transistor M5. The first logical output N1 is thus set to a logical state of "0" during the evaluation state of the DSFF 12. The delay in the start time for charging the output node 42 causes the first logical output N1 to activate the transistor M2. Thus, even if the output node 42 starts to discharge, the discharge of the output node 42 is impeded by the transistor M2 (which is activated) thereby resulting in the output node 42 getting quickly pulled back to the high voltage state. Thus, the second logical output N2 is maintained at logical state of "1." Accordingly, the differential logical output DLO is provided to have a differential output state of "0/1," during the evaluation state when the inverted data input D' is at logical state of "1" and the data input D is at logical state of "0." Likewise, the second amplifier branch 32 wins the current race if the second input gate network 28 charges the output node 42 of the second input gate network 28 to a voltage level sufficient to activate the transistor M6 and deactivate the transistor M8 before the first input gate network 26 charges the output node 40 of the first input gate network 26 to a voltage level sufficient to activate the transistor M5 and deactivate the transistor M7. In one embodiment, the second input gate network 28 wins the current race if the transmission gate 46[D] in the second input gate network 28 is activated by the data input D being at logical state of "0." Due to a conductance of the second input gate network 28 being higher than a conductance of the first input gate network 26, the isolated control node 38 starts to charge before the isolated control node 36. Accordingly, the isolated control node 38 activates the transistor M6 and deactivates the transistor M8. As a result, the output node 42 starts to discharge through the transistor M4 and the transistor M6. The first logical output N1 is thus set to a logical state of "0" during the evaluation state of the DSFF 12. The delay in the start time for charging the output node 40 causes the second logical output N2 to activate the transistor M1. Thus, even if the output node 40 starts to discharge, the discharge of the output node 40 is impeded by the transistor M1 (which is activated) thereby resulting in the output node 40 getting quickly pulled back to the high voltage state and the first logical output N1 being maintained at logical state of "1." Accordingly, the differential logical output DLO is provided to have a differential output state of "1/0."

The logical outputs Q and Q' of the SR latch 34 are adjusted accordingly by the SR latch 34. The differential logical output DLO includes a first logical output N1 that is received by the input terminal S of the SR latch 34. In this embodiment, the SR latch 34 is an SR latch. The input terminal S is the set terminal of the SR latch 34, and the first logical signal N1 is received at the input terminal S. The differential logical output DLO includes a second logical output N2 that is received by the input terminal R of the SR latch 34. The input terminal N2 is the reset terminal of the SR latch 34, and the second logical output N2 is received at the input terminal R. Note that when the differential logical output DLO is set to the precharge state after the reset state, the SR latch 34 is configured to hold the data output Q and the inverted data output Q'. However, after the evaluation state, the SR latch 34 is configured to set the data output Q to logic "1" and the inverted data output Q' to logic "0" in response to the differential logical output DLO being provided at the differential output state of "0/1" and to set the data output Q to logic "0" and the inverted data output Q' to logic "1" in response to the differential logical output DLO being provided at the differential output state of "1/0."

Furthermore, note that after evaluation completes, all nodes in the DSFF 12 have a closed path to either the supply voltage VD or ground. Because of this, the output nodes 40, 42 are latched, and no change in the inverted data input D' and the data input D in either of the first input gate network 26 and the second input gate network 28 will have any effect on the logical states stored at the output nodes 40, 42 until the beginning of the next evaluation.

To provide scan functionality during a scan mode, the first amplifier branch 30 shown in FIG. 2 includes the transistor M13, the transistor M14, and the transistor M15 while the second amplifier branch 32 includes a transistor M16, a transistor M17, and a transistor M18. With respect to the first amplifier branch 30, each of the transistors M13, M14 is a NFET. The transistor M13 and the transistor M14 are stacked to form a discharge path 48 configured to be opened and closed. The discharge path 48 is operably associated with the output node 40 so that the output node 40 is discharged through the discharge path 48 when the discharge path 48 is closed. The discharge path 48 is opened and closed in accordance with a test enable input TE[E] and a test input TI in order to operate scan functionality. In this embodiment, a drain of the transistor M13 is coupled to the source of the transistor M3 and the drain of the transistor M5 at a discharge path connection node DPCN-16. A source of the transistor M13 is coupled to a drain of the transistor M14. A gate of the transistor M13 is configured to receive the test enable input TE[E]. Furthermore, a source of the transistor M14 is coupled to ground while a gate of the transistor M14 is configured to receive the test input TI. The discharge path 48 therefore provides a shunt path between the discharge path connection node DPCN-16 to ground that is configured to be opened and closed in accordance with the test enable input TE[E] and the test input TI.

Furthermore, the first amplifier branch 30 includes the transistor M15, which is a PFET. In this embodiment, the source of the transistor M7 is coupled to a drain of the transistor M15. A source of the transistor M15 is configured to receive the supply voltage VD, while a gate of the transistor M15 is configured to receive the test enable input TE[E]. Thus, the transistor M15 is activated and deactivated in accordance with the test enable input TE[E]. As such, the first amplifier branch 30 is configured to switch between enabling and disabling the first input gate network 26 from charging the isolated control node 36.

With respect to the second amplifier branch 32, each of the transistors M16, M17 is a NFET. The transistor M16 and the transistor M17 are stacked to form a discharge path 50 configured to be opened and closed. The discharge path is operably associated with the output node 42 so that the output node 42 is discharged through the discharge path 50 when the discharge path 50 is closed. The discharge path 50 is opened and closed in accordance with the test enable input TE[E] and an inverted test input TI' in order to operate scan functionality. The inverted test input TI' is inverted with respect to the test input TI. In this embodiment, a drain of the transistor M16 is coupled to the source of the transistor M4 and the drain of the transistor M6 at a discharge path connection node DPCN-18. A source of the transistor M16 is coupled to a drain of the transistor M17. A gate of the transistor M16 is configured to receive the test enable input TE[E]. Furthermore, a source of the transistor M17 is coupled to ground while a gate of the transistor M17 is configured to receive the test input TI. The discharge path 50 therefore provides a shunt path between the discharge path connection node DPCN-18 to ground that is configured to be opened and closed in accordance with the test enable input TE[E] and the test input TI.

Furthermore, the second amplifier branch 32 includes the transistor M18, which is a PFET. In this embodiment, the source of the transistor M8 is coupled to a drain of the transistor M18. A source of the transistor M18 is configured to receive the supply voltage VD, while a gate of the transistor M18 is configured to receive the test enable input TE[E]. Thus, the transistor M18 is activated and deactivated in accordance with the test enable input TE[E]. As such, the second amplifier branch 32 is configured to switch between enabling and disabling the second input gate network 28 from charging the isolated control node 38.

During a normal operational mode, the test enable input TE[E] and the test input TI are each provided at logical state of "0." Also, during the normal operational mode, the test input TI is provided at logical state of "0," and the inverted test input TI' is provided at logical state of "1." Thus while the DSFF 12 shown in FIG. 2 is operating in the normal mode, the DSFF 12 shown in FIG. 2 operates in the same manner as the DSFF 12 shown in FIG. 1 during both the reset state and the evaluation state in accordance with the non-inverted clock signal CLK and the inverted clock signal CLK'. As such, in the normal operational mode, the discharge path 48 and the discharge path 50 are each open. This is because the transistor M13 and the transistor M16 are each deactivated in response to the test enable input TE[E] being provided at logical state of "0." Furthermore, the first amplifier branch 30 enables the first input gate network 26 to charge the isolated control node 36, while the second amplifier branch 32 enables the second input gate network 28 to charge the isolated control node 38. This is because the transistor M15 and the transistor M18 are both activated in response to the test enable input TE[E] being provided at logical state of "0."

Additionally, the first amplifier branch 30 enables the first input gate network 26 to charge the isolated control node 36, while the second amplifier branch 32 enables the second input gate network 28 to charge the isolated control node 38. This is because the transistor M15 and the transistor M18 are both activated in response to the test enable input TE[E] being provided at logical state of "0." Furthermore, since the transistor M15 is activated, the first amplifier branch 30 enables the transmission gate 44[F] to drive the isolated control node 36 in accordance with the first logical output N1 of the first amplifier branch 30. Since the transistor M18 is activated, the second amplifier branch 32 enables the transmission gate 46[F] is to drive the isolated control node 38 in accordance with the second logical output N2 of the second amplifier branch 32.

During the scan mode, the differential sense amplifier DSA is configured to close one of the discharge paths 48, 50 and maintain the other one of the discharge paths 50, 48 open based on the test input TI. As such, in the scan mode and while the test enable input TE[E] is provided at logical state of "1", the first amplifier branch 30 is configured to close the discharge path 48 if the test input TI is a logical state of "1." This is because the transistor M13 is activated in response to the test enable input TE[E] being a logical state of "1," and the transistor M14 is activated in response to the test input TI being a logical state of "1." If the test input TI is logical state of "1," the inverted test input TI' is a logical state of "0." Accordingly, the second amplifier branch 32 is configured to maintain the discharge path 50 open. This is because the transistor M17 configured to be deactivated by the inverted test input TI' is a logical state of "0," and thus the test input TI is a logical state of "1."

During the scan mode, the non-inverted clock signal CLK is maintained low at logic "0" while the inverted clock signal is maintained high at logical state of "1." To test a stream of test bits with the DSFF 12 shown in FIG. 4, the test enable input TE[E] is used for synchronization. This allows for chains of TLEs, each of which may be like the DSFF 12 shown in FIG. 4 to be connected to provide a scan chain mechanism. A global test input may be provided at an entry point of the TLEs in the scan chain mechanism to set a logical state of the test input TI. As explained in further detail below, the test enable input TE[E] is utilized for synchronization, and thus both a logical state of the global test input and the test input TI can be set by one of the test bits during each scan cycle. Scan cycles can be repeated for each of the test bits and thereby provide testing for the stream of test bits.

Referring again to the DSFF 12 shown in FIG. 4, a scan cycle begins when the non-inverted clock signal CLK and the test enable input TE[E] are both provided at logical state of "0" (and thus the inverted clock signal CLK' being provided at a logical "1"). A logical state of the test input TI and a logical state of the inverted logical input TI' may then be set as a result of a logical state of the global test input. Next, a logical state of the test enable input TE[E] is set to a logical state of "1," which indicates the scan mode. The clock signal remains in the logical state "0," and thus the inverted clock signal CLK' remains in the logical state "1."

In the scan mode and while the test enable input TE[E] is provided at logical state of "1", the second amplifier branch 32 is configured to close the discharge path 50 if the test input TI is a logical state of "0." If the test input TI is logical state of "0," the inverted test input TI' is a logical state of "1." As such, the transistor M16 is activated in response to the test enable input TE[E] being a logical state of "1," and the transistor M17 is activated in response to the inverted test input TI' being a logical state of "1." The first amplifier branch 30 is configured to maintain the discharge path 48 open. This is because the transistor M14 is configured to be deactivated by the test input TI being a logical state of "0." Furthermore, the first amplifier branch 30 disables the first input gate network 26 from charging the isolated control node 36 while the second amplifier branch 32 disables the second input gate network 28 from discharging the isolated control node 38. This is because the transistor M15 and the transistor M18 are both deactivated in response to the test enable input TE[E] being provided at logical state of "1." Therefore, whether the output node 40 discharges during the scan mode depends on whether the discharge path 48 is closed or is maintained open, which is determined by the test input TI. Furthermore, whether the output node 42 discharges during the scan mode depends on whether the discharge path 50 is closed or is maintained open, which is determined by the test input TI.

As such, the logical output N1 is provided to be a logical state of "0" by the first amplifier branch 30, and the logical output N2 is provided by the second amplifier branch 32 as a logical state of "1" during the scan mode when the test input TI is provided at a logical state of "1." Thus, the differential logical output DLO is provided to the SR latch 34 as differential logic "0/1." The SR latch 34 thus generates the data output Q as a logical state of "1" and the inverted data output Q' as a logical state of "0." Additionally, the logical output N1 is provided to be a logical state of "1" by the first amplifier branch 30, and the logical output N2 is provided by the second amplifier branch 32 as a logical state of "0" during the scan mode when the test input TI is provided at a logical state of "0." Thus, the differential logical output DLO is provided to the SR latch 34 as differential logic "1/0." The SR latch 34 thus generates the data output Q as a logical state of "0" and the inverted data output Q' as a logical state of "1." The test input TI can now be provided again at a logical state of "0." If there are more test bits in the stream, the global test input can set in accordance with the next test bit, and the scan cycle can be repeated until all the test bits in the stream have been scanned.

Figure 5:
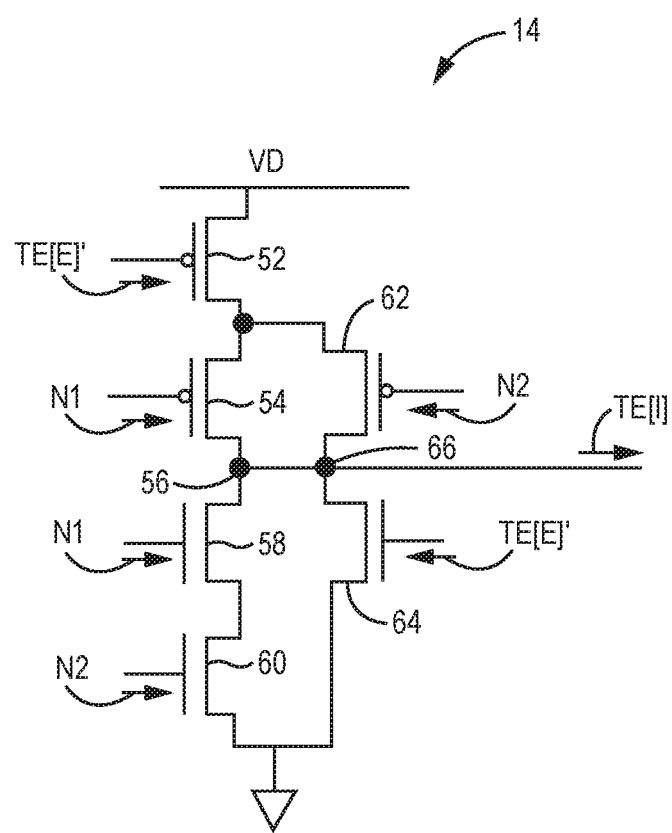
FIG. 5 illustrates an exemplary circuit diagram of one embodiment of the CDC shown in FIG. 1.

FIG. 5 illustrates an exemplary circuit diagram of the CDC 14. Each of the CDC 14 shown in FIGS. 2 and 3 may be provided in the same manner the CDC 14 shown in FIG. 5. The CDC 14 shown in FIG. 5 has a PFET 52 and a PFET 54 that are stacked. In this embodiment, the PFET 52 has a source configured to receive the supply voltage, and a drain coupled to a source of the PFET 54. The PFET 54 has a drain coupled to a connection node 56.

The CDC 14 shown in FIG. 5 also has a NFET 58 and a NFET 60 that are stacked. In this embodiment, the NFET 58 has a drain connected to the connection node 56, and a source connected to a drain of the NFET 60. The NFET 60 connected to ground. Furthermore, the CDC 14 includes a PFET110 and an NFET 64. A source of the PFET 62 is connected to the drain of the PFET 52 and the source of the PFET 54. A drain of the PFET 62 is connected to a connection node 66. The connection node 66 is directly connected to the connection node 56. A drain of the NFET 64 is connected to the connection node 66. A source of the NFET 64 is connected to ground.

A gate of the PFET 52 receives the inverted test enable input TE[E]', a gate of the PFET 54 receives the first logical output N1, a gate of the NFET 58 receives the first logical output N1, a gate of the NFET 60 receives the second logical output N2, a gate of the PFET 62 receives the second logical output N2, and a gate of the NFET 64 receives the inverted test enable input TE[E]'. Accordingly, when the test enable input TE[E] has a logical state "1," the inverted test enable input TE[E]' has a logical state "0." Also, when the test enable input TE[E] has a logical state "0," the inverted test enable input TE[E]' has a logical state "1."

The CDC 14 is configured to generate the test enable input TE[I] from the connection node 56 and the connection node 66. Note that if the first logical output N1 and the second logical output N2 are both have the logical state "1" during the precharge state, the PFET 54 and the PFET 62 will be off and the NFET 58 and the NFET 60 will be on regardless of the logical state of the inverted test enable input TE[E]'. As such, the test enable input TE[I] will be generated at ground and thus with a logical state "0." In this case, this indicates the normal operational mode. Similarly, if the inverted test enable input TE[E]' has the logical state "1", the PFET 52 will be off and the NFET 64 and the NFET 60 will be on regardless of the logical states of the first logical output N1 and the second logical output N2. As such, the test enable input TE[I] will be generated at ground and thus with a logical state "0."

However, if the first logical output N1 and the second logical output N2 are both in opposite logical states due to the DLO being provided in the differential output state and if the inverted test enable input TE[E]' has a logical state of "0," then the PFET 52 an either the PFET 54 or the PFET 62 will be on. Additionally, the NFET 64 and either the NFET 58 or the NFET 60 will be off. As such, the test enable input TE[I] is generated near the supply voltage VD and have a logical state "1." In this case, the logical state "1" indicates the scan mode.

Those skilled in the art will recognize improvements and modifications to the preferred embodiments of the present disclosure. All such improvements and modifications are considered within the scope of the concepts disclosed herein and the claims that follow.

What is claimed is:

1. A digital circuit comprising:
    a first differential sense flip flop (DSFF) configured to receive a first data input, a first test input, a first test enable input, and a clock signal wherein the first DSFF is configured to generate a first differential logical output so that the first differential logical output is set to any one of a set of differential output states in accordance with the first data input in response to the first test enable input indicating a normal operational mode and the clock signal being in a first clock state, the first differential logical output is set in a precharge state in response to the first test enable input indicating the normal operational mode and the clock signal being in a second clock state, and the first differential logical output is provided in the any one of the set of differential output states in accordance with the first test input in response to the first test enable input indicating a scan mode and the clock signal being in the second clock state;
    a first completion detection circuit (CDC) operably associated with the first DSFF wherein the first CDC is configured to generate a second test enable input so that the second test enable input is set to indicate the normal operational mode in response to the first test enable input indicating the normal operational mode and is configured to set the second test enable input so as to indicate the scan mode in response to the first test enable input indicating the scan mode and the first differential logical output being in the any one of the set of differential output states; and
    an inverter gate configured to generate an inverted test enable input from the first test enable input, wherein the first CDC comprises a first P-channel field effect transistor (PFET), a second PFET, and a third PFET, a first N-channel field effect transistor (NFET), a second NFET, and a third NFET and wherein:
        the first DSFF is configured to generate the first differential logical output as a first logical output and a second logical output
        the first PFET and the second PFET are stacked so that the first PFET is configured to receive a supply voltage and the second PFET is connected to a first connection node wherein the first PFET has a first gate configured to receive the inverted test enable input and the second FET has a second gate configured to receive the first logical output;
        the first NFET and the second NFET are stacked so that the first NFET is connected to the first connection node and the second NFET is connected to a ground, the first NFET has a third gate configured to receive the first logical output and the second NFET has a fourth gate configured to receive the second logical output;
        the third PFET is connected from between the first PFET and the second PFET to a second connection node, wherein the first connection node and the second connection node are directly connected to one another and wherein the third PFET has a fifth gate configured to receive the second logical output; and the third NFET is connected between the second connection node and ground wherein the third NFET has a sixth gate configured to receive the inverted test enable input.

2. The digital circuit of claim 1 further comprising a second DSFF configured to receive the second test enable input from the first CDC, a second data input, a second test input, and the clock signal wherein the second DSFF is configured to generate a second differential logical output so that the second differential logical output is set to the any one of the set of differential output states in accordance with the second data input in response to the second test enable input indicating the normal operational mode and the clock signal being in the first clock state, the second differential logical output is set in the precharge state in response to the second test enable input indicating the normal operational mode and the clock signal being in the second clock state, and the second differential logical output is provided in the any one of the set of differential output states in accordance with the second test input in response to the second test enable input indicating the scan mode and the clock signal being in the second clock state.

3. The digital circuit of claim 2 wherein:
the second DSFF is further configured to generate a first data output; and
the first DSFF is configured to receive the first test input as the first data output from the second DSFF.

4. The digital circuit of claim 3 further comprising a first combinational logic circuit (CL), wherein the first CL is configured to receive the first data output from the second DSFF and generate the first data input that is received by the first DSFF.

5. The digital circuit of claim 4 wherein the second DSFF is configured to
hold the first data output in response to the second differential logical output being in the precharge state; and
set the first data output in accordance with the second differential logical output in response to the second differential logical output being in the any one of the set of differential output states.

6. The digital circuit of claim 2 further comprising a first combinational logic circuit (CL) wherein:
the second DSFF is further configured to generate a first data output; and
the first CL is configured to receive the first data output from the second DSFF and generate the first data input that is received by the first DSFF.

7. The digital circuit of claim 2 further comprising a second CDC operably associated with the second DSFF wherein the second CDC is configured to generate a third test enable input so that the third test enable input is set to indicate the normal operational mode in response to the second test enable input indicating the normal operational mode and is configured to set the third test enable input so as to indicate the scan mode in response to the second test enable input indicating the scan mode and the second differential logical output being in the any one of the set of differential output states.

8. The digital circuit of claim 7 further comprising a third DSFF configured to receive the third test enable input from the second CDC, a third data input, a third test input, and the clock signal wherein the third DSFF is configured to generate a third differential logical output so that the third differential logical output is set to the any one of the set of differential output states in accordance with the third data input in response to the third test enable input indicating the normal operational mode and the clock signal being in the first clock state, the third differential logical output is set in the precharge state in response to the third test enable input indicating the normal operational mode and the clock signal being in the second clock state, and the third differential logical output is provided in the any one of the set of differential output states in accordance with the third test input in response to the third test enable input indicating the scan mode and the clock signal being in the second clock state.

9. The digital circuit of claim 8 further comprising a third CDC operably associated with the third DSFF wherein the third CDC is configured to generate a fourth test enable input so that the fourth test enable input is set to indicate the normal operational mode in response to the third test enable input indicating the normal operational mode and is configured to set the fourth test enable input so as to indicate the scan mode in response to the third test enable input indicating the scan mode and the third differential logical output being in the any one of the set of differential output states.

10. The digital circuit of claim 9 wherein the fourth test enable input is provided by the third CDC as a global test enable output.

11. The digital circuit of claim 9 wherein the first test enable input is received by the first DSFF as a global test enable input.

12. The digital circuit of claim 9 wherein:
the first DSFF is further configured to generate a first data output;
the second DSFF is further configured to generate a second data output; and
the third DSFF is further configured to generate a third data output.

13. The digital circuit of claim 12 wherein:
the first DSFF is further configured to receive the first test input as the second data output from the second DSFF; and
the second DSFF is further configured to receive the second test input as the second data output from the third DSFF.

14. The digital circuit of claim 13 wherein the third DSFF is configured to receive the third test input as a global test input.

15. The digital circuit of claim 13 further comprising a first combination logic circuit (CL), a second CL, and a third CL wherein:
the first CL is configured to receive the second data output and generate the first data input in accordance with the second data output;
the second CL is configured to receive the third data output and generate the second data input in accordance with the third data output; and
the third CL is configured to receive a fourth data output and generate the third data input in accordance with the fourth data output.

16. The digital circuit of claim 15 wherein the third CL is configured to receive the fourth data output as a global data output.

17. The digital circuit of claim 1 wherein the first DSFF comprises:
a first input gate network configured to receive the first data input;

a second input gate network configured to receive a first inverted data input which is an inversion of the first data input;

a differential sense amplifier operably associated with the first input gate network and the second input gate network, wherein the differential sense amplifier is configured to generate the first differential logical output; and an SR latch configured to
 generate a first data output;
 hold the first data output in response to the first differential logical output being in the precharge state; and
 set the first data output in accordance with the first differential logical output being in the any one of the set of differential output states.

18. The digital circuit of claim 17 wherein the differential sense amplifier is configured to provide the differential logical output as feedback to the first input gate network and as feedback to the second input gate network.

\* \* \* \* \*